(12) United States Patent
Wang

(10) Patent No.: US 8,638,178 B1
(45) Date of Patent: Jan. 28, 2014

(54) METHODS OF TESTING PACKAGED THIN-FILM PIEZOELECTRIC-ON-SEMICONDUCTOR MICROELECTROMECHANICAL RESONATORS HAVING HERMETIC SEALS

(75) Inventor: Ye Wang, Cupertino, CA (US)

(73) Assignee: Integrated Device Technology inc., San Jose, CA (US)

( * ) Notice: Subject to any disclaimer, the term of this patent is extended or adjusted under 35 U.S.C. 154(b) by 58 days.

(21) Appl. No.: 13/407,484

(22) Filed: Feb. 28, 2012

Related U.S. Application Data

(63) Continuation-in-part of application No. 13/250,560, filed on Sep. 30, 2011.

(51) Int. Cl.
*H03B 5/18* (2006.01)

(52) U.S. Cl.
USPC .......... 331/96; 331/107 A; 331/154; 333/200; 310/344; 324/633

(58) Field of Classification Search
USPC ......... 331/107 A, 96, 154; 333/200; 310/344; 324/633
See application file for complete search history.

(56) References Cited

U.S. PATENT DOCUMENTS 6,831,531 B1 * 12/2004 Giousouf et al. ............. 333/200

OTHER PUBLICATIONS

Kim, Bongsang et al. "Temperature Dependence of Quality Factor in MEMS Resonators", Journal of Microelectromechanical Systems ISSN 10577157; 2008, vol. 17; 4 pages.

* cited by examiner

*Primary Examiner* — Arnold Kinkead
(74) *Attorney, Agent, or Firm* — Myers Bigel, et al.

(57) ABSTRACT

Methods of testing packaged thin-film piezoelectric-on-semiconductor (TPoS) microelectromechanical resonators having hermetic seals include measuring a quality factor (Q) of resonance of the packaged resonator at at least two unequal temperatures to determine whether a $\Delta Q/\Delta T$ is significantly different (e.g, by at least 50%) over a temperature range ($\Delta T$) spanning a smallest and largest of the at least two temperatures. These measurements are performed for a packaged resonator having a $Q_{AIR} < Q_{TED}$, where $Q_{AIR}$ is the quality factor of resonance of the packaged resonator due to air damping and $Q_{TED}$ is the quality factor of resonance of the packaged resonator due to thermoelastic damping.

4 Claims, 29 Drawing Sheets

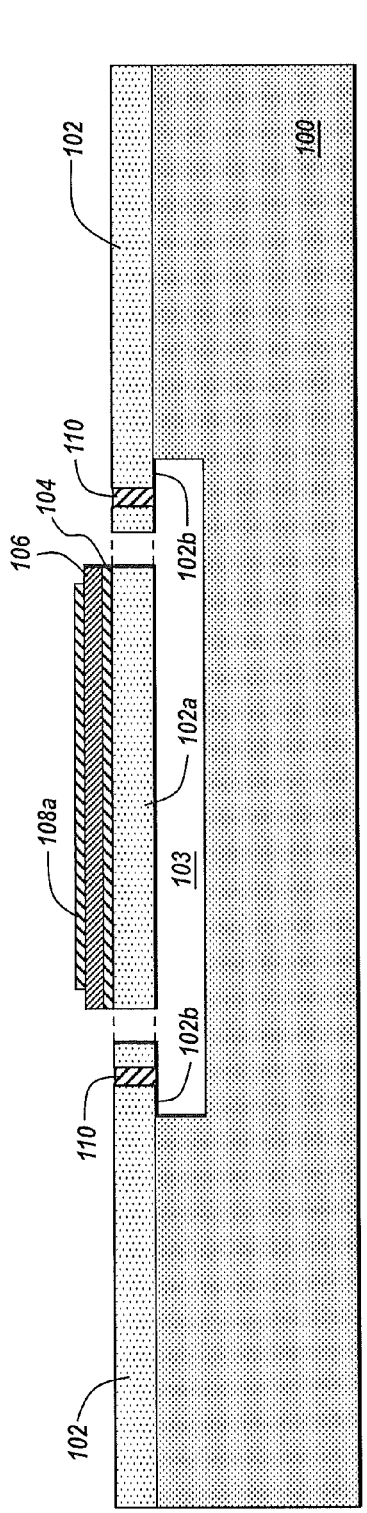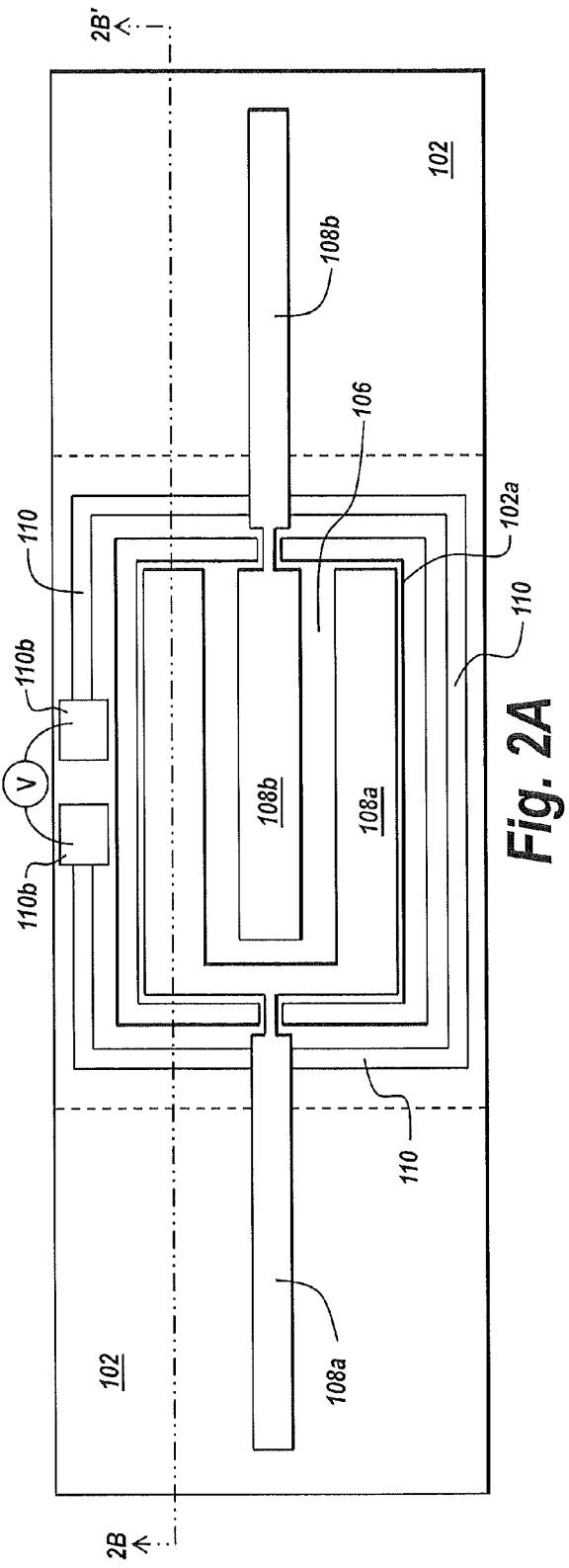

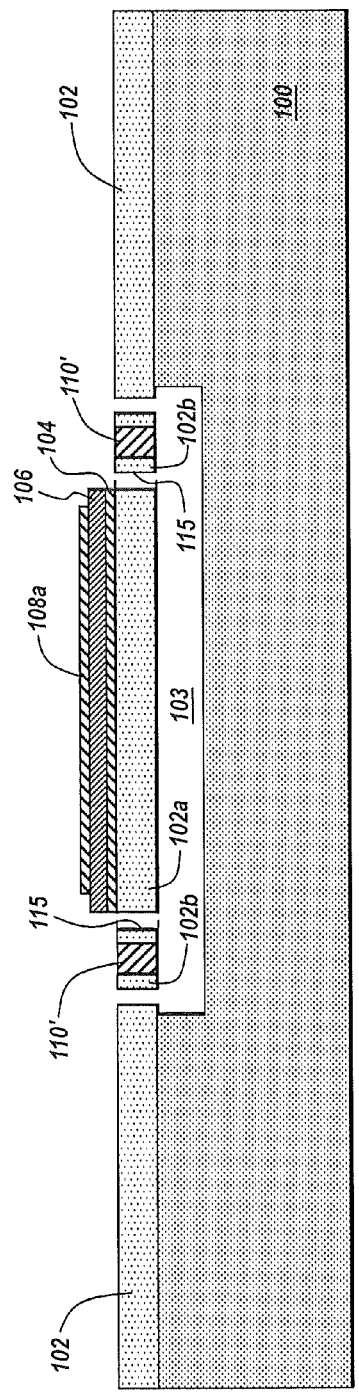
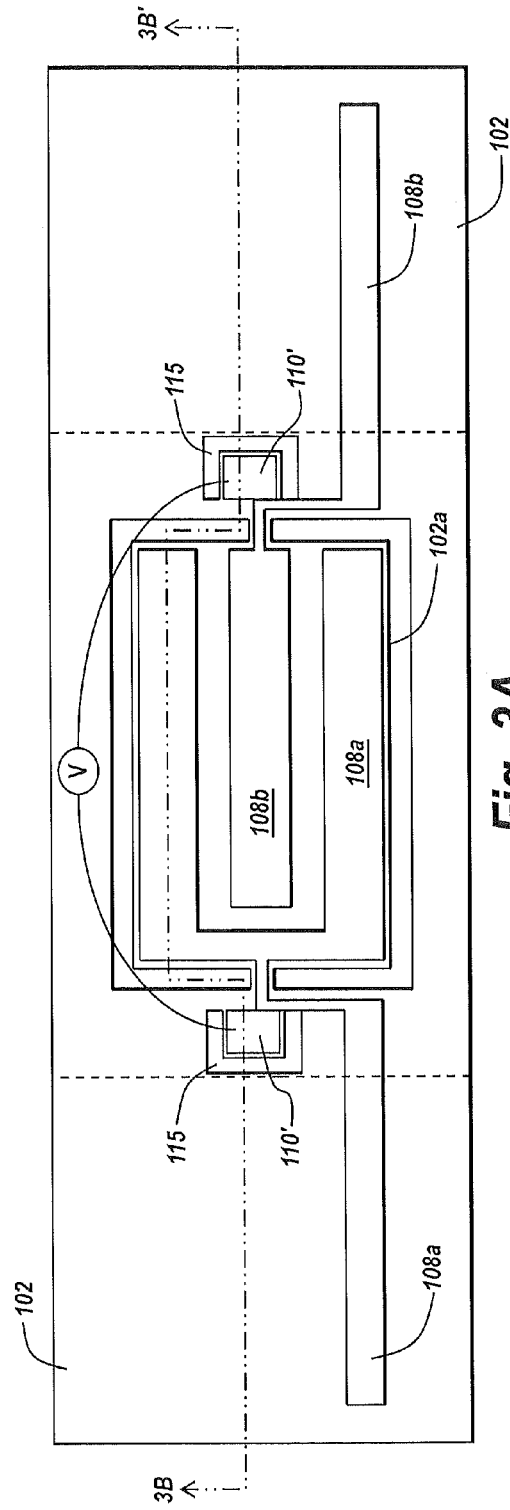
Fig. 3B
Fig. 3A

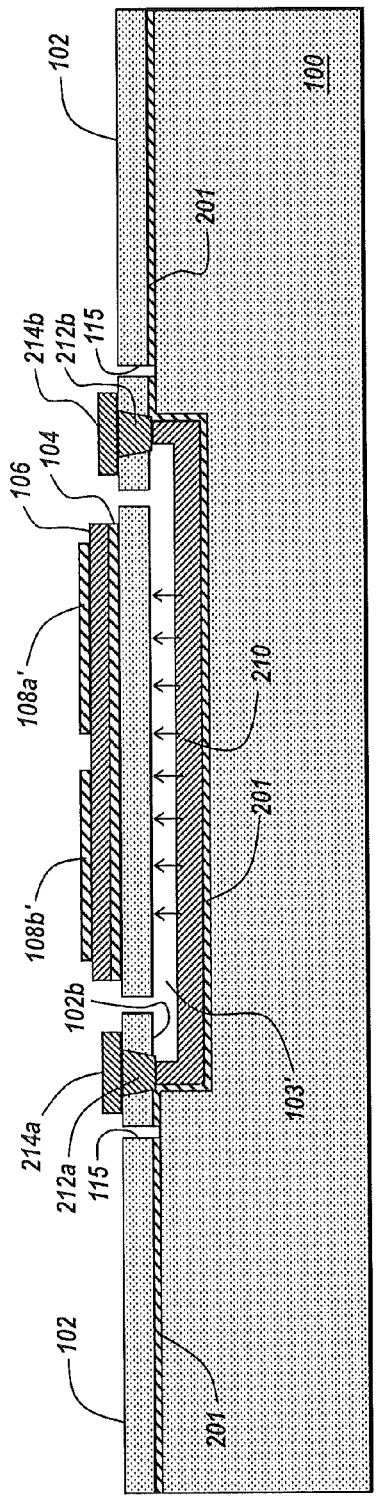
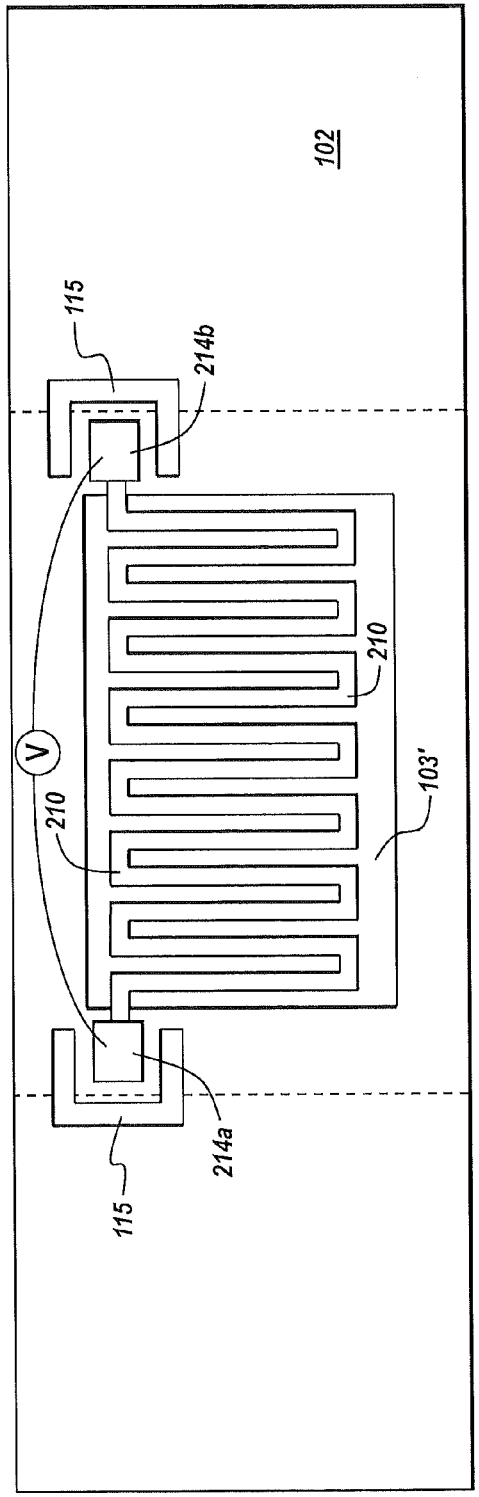
Fig. 4F
Fig. 4G

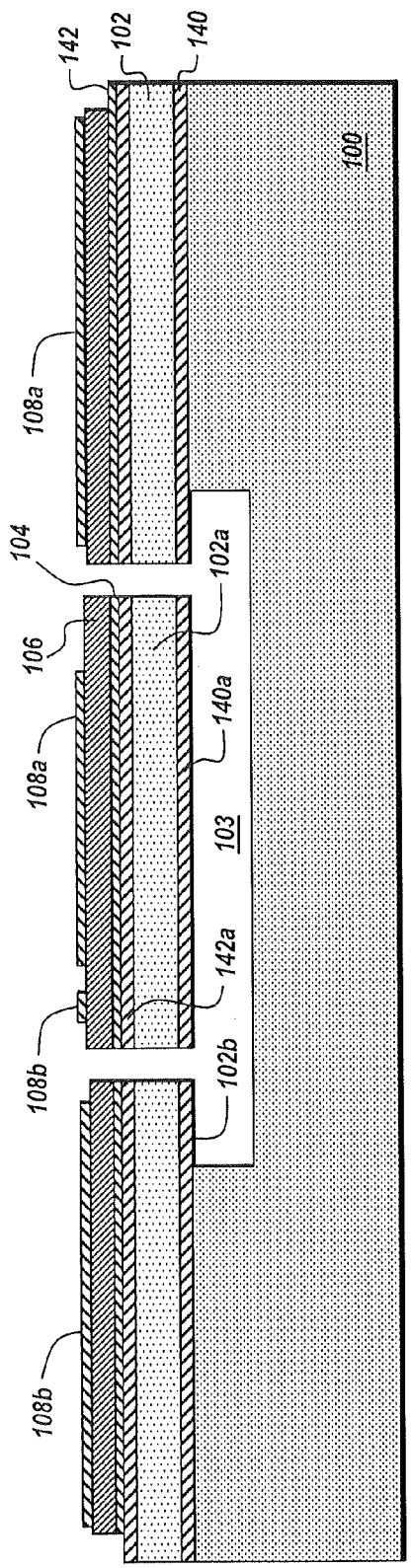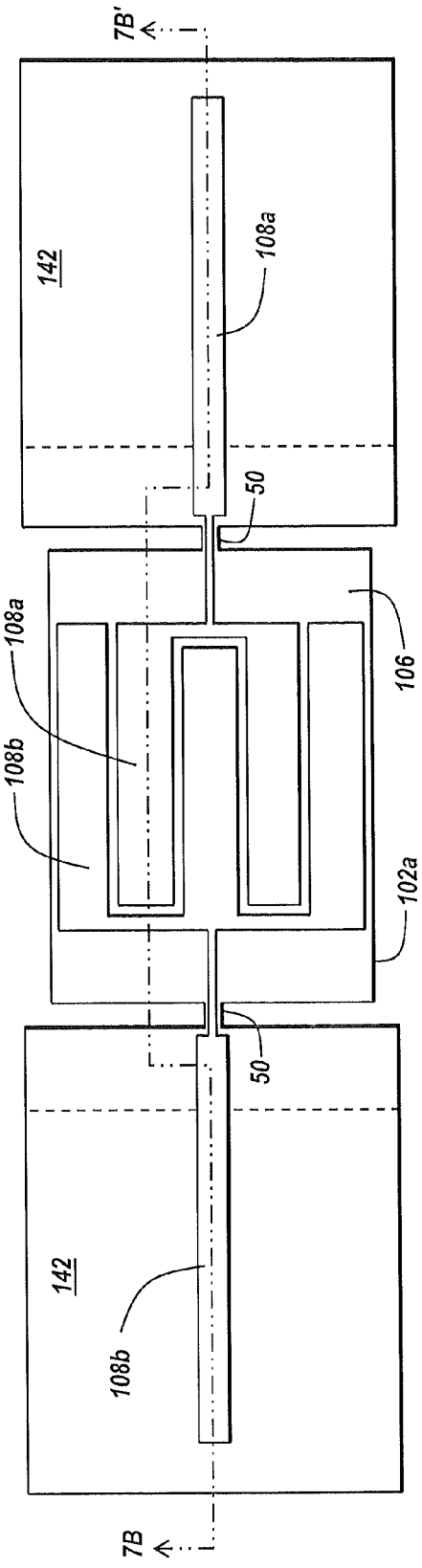
Fig. 7B
Fig. 7A

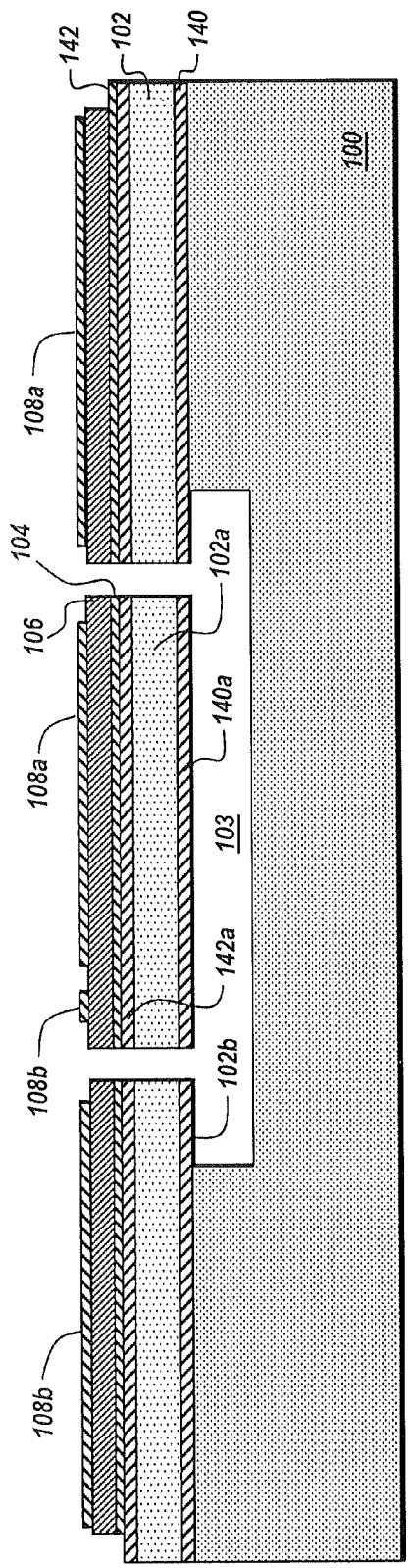
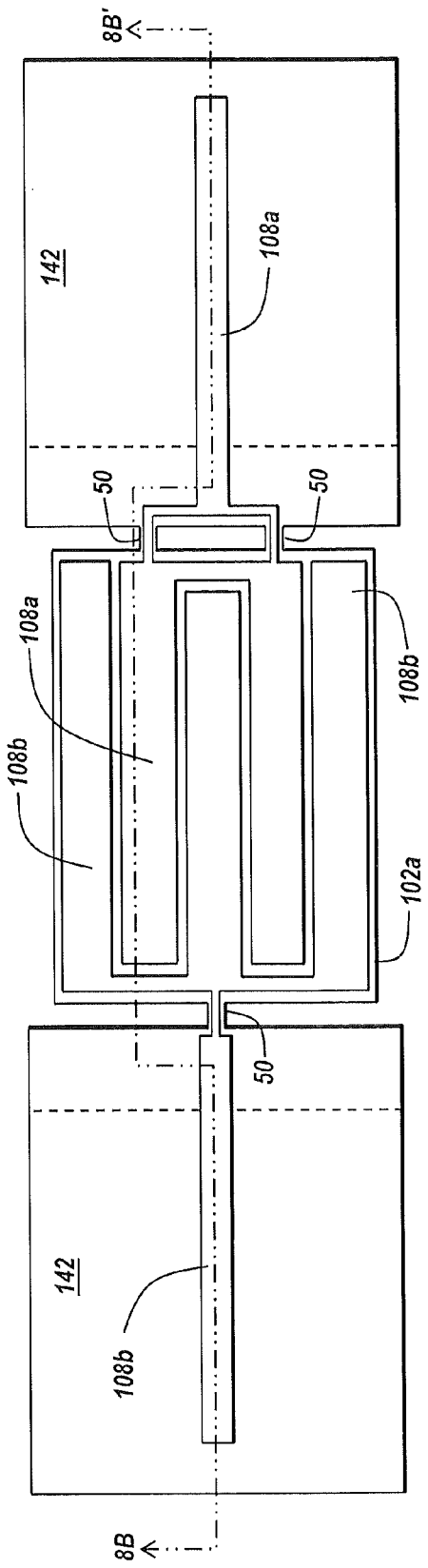
Fig. 8B
Fig. 8A

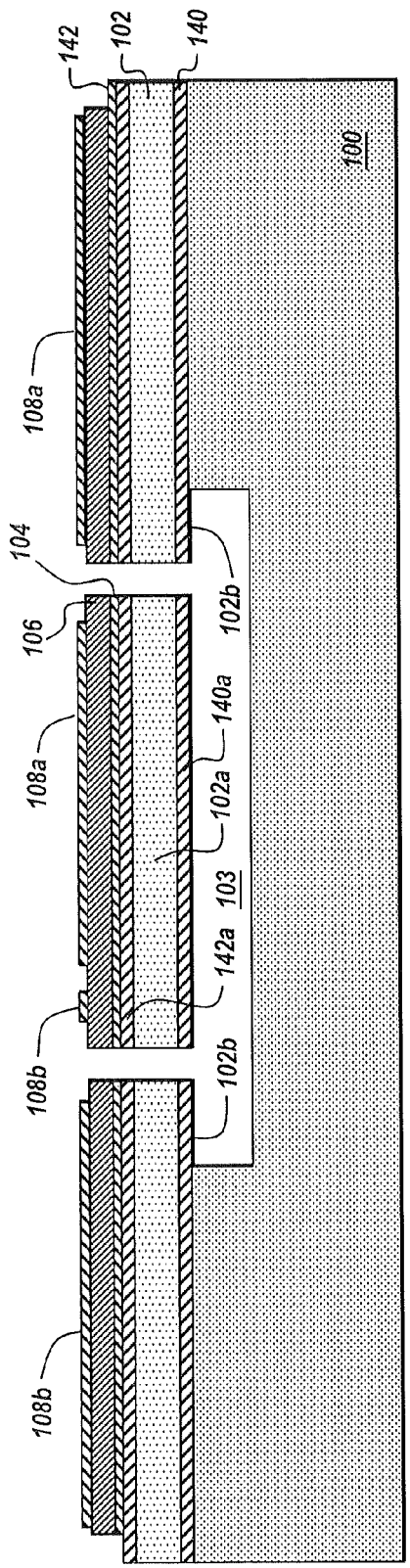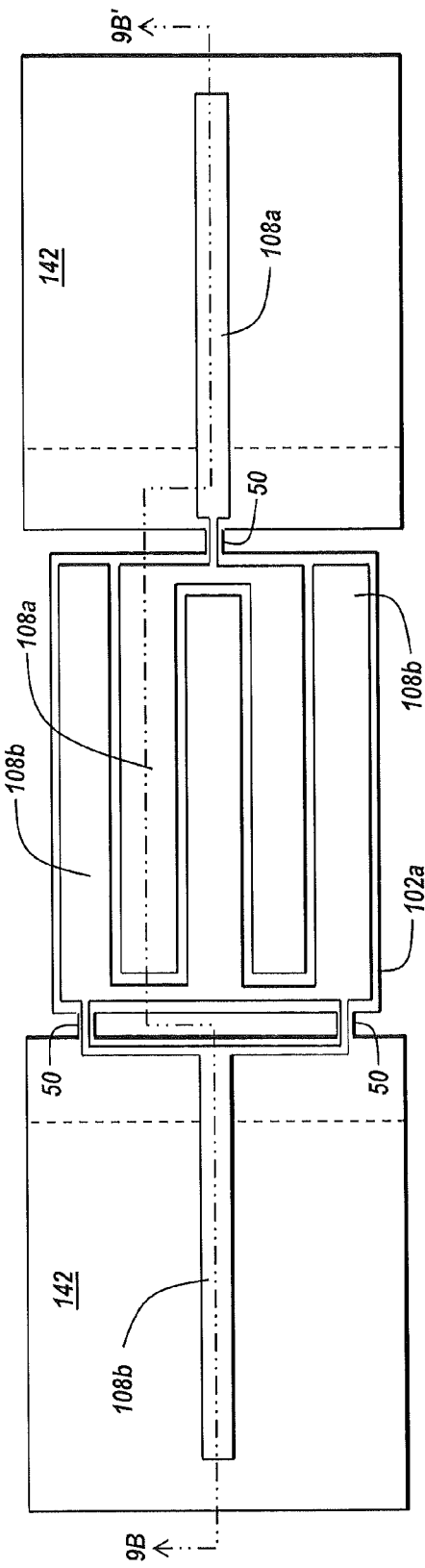
Fig. 9B
Fig. 9A

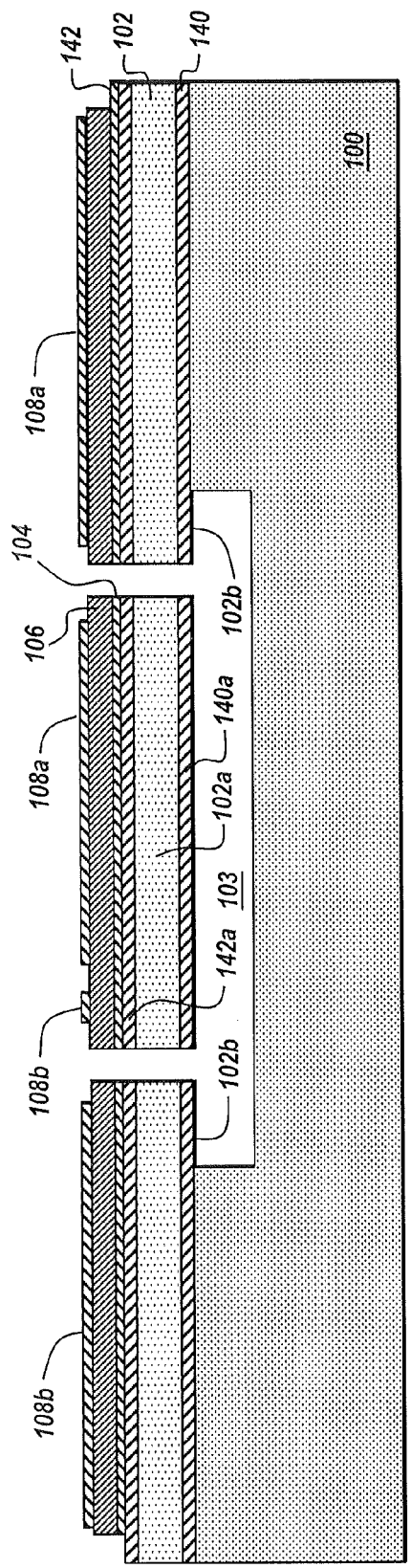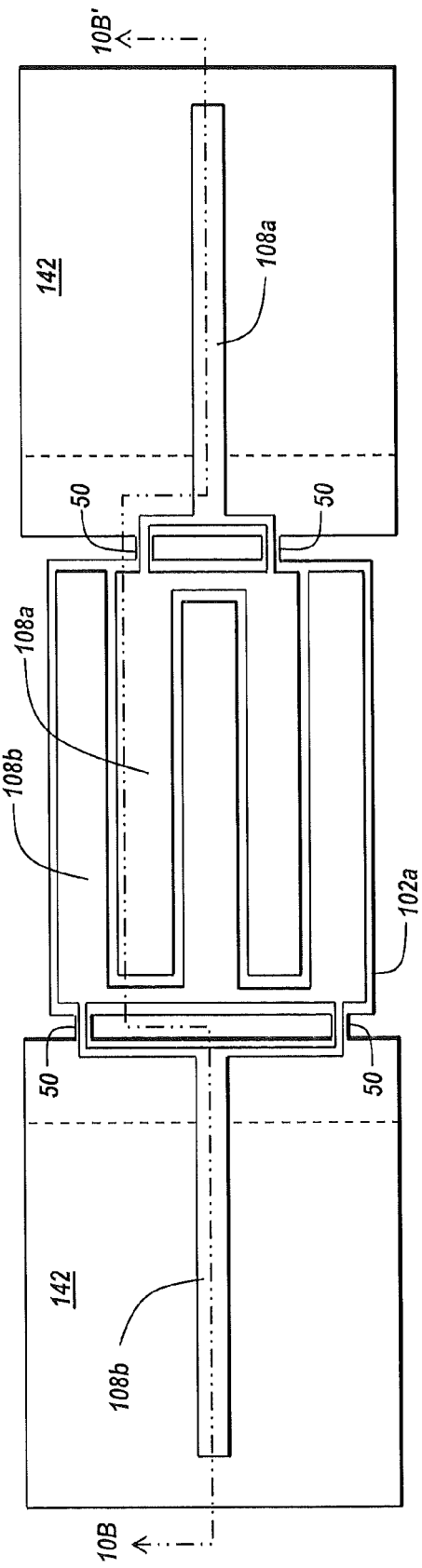
Fig. 10B
Fig. 10A

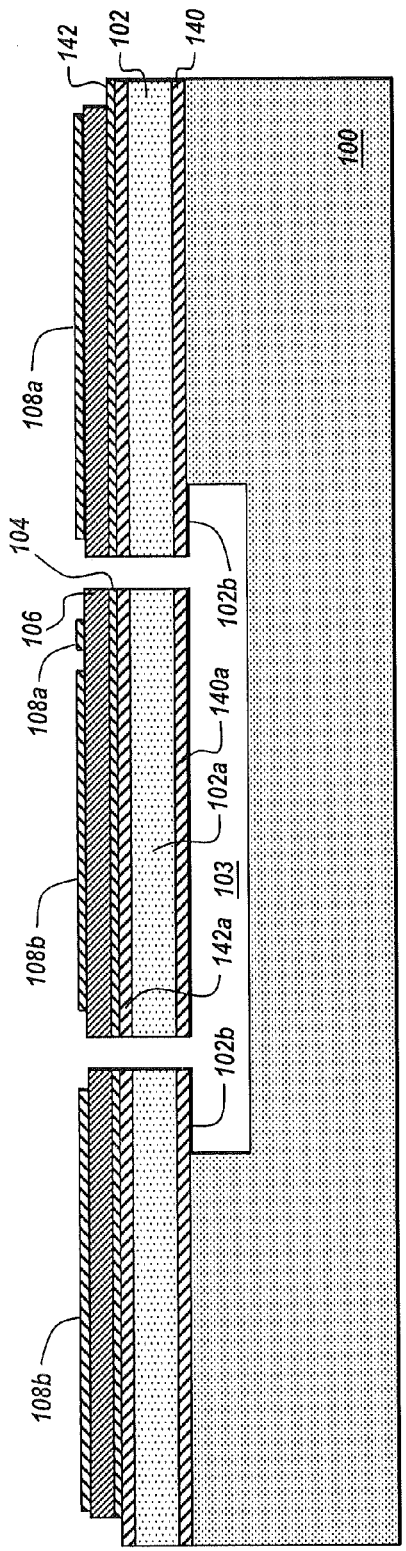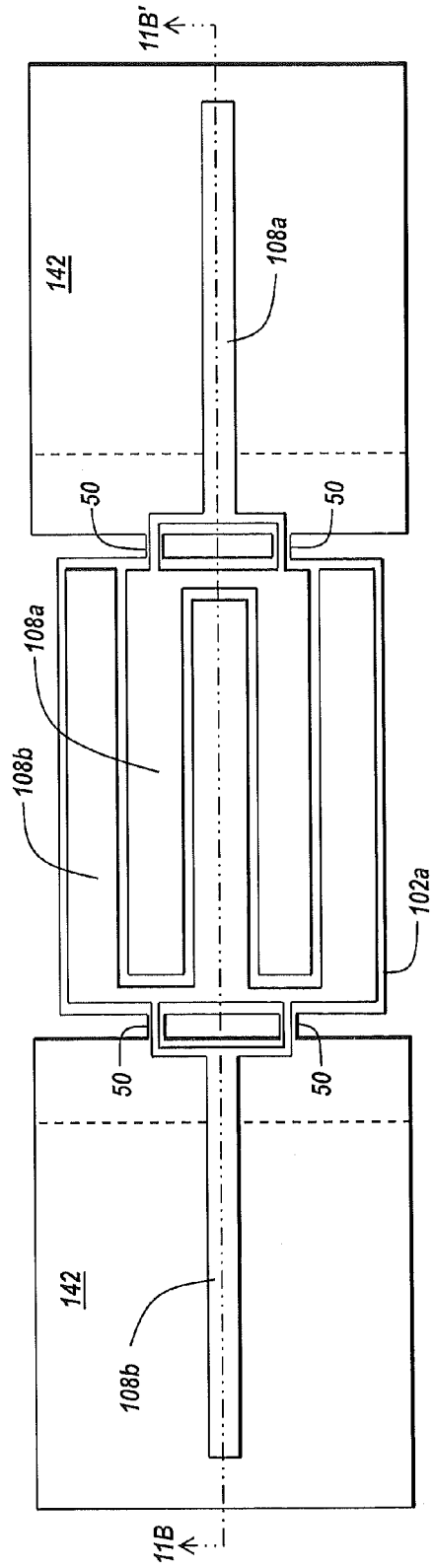
Fig. 11B
Fig. 11A

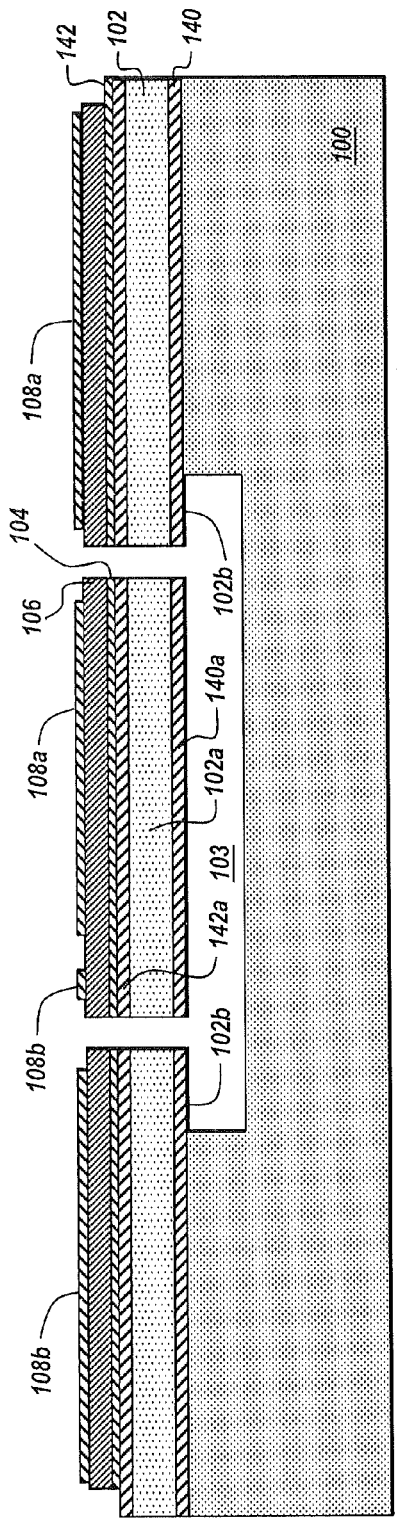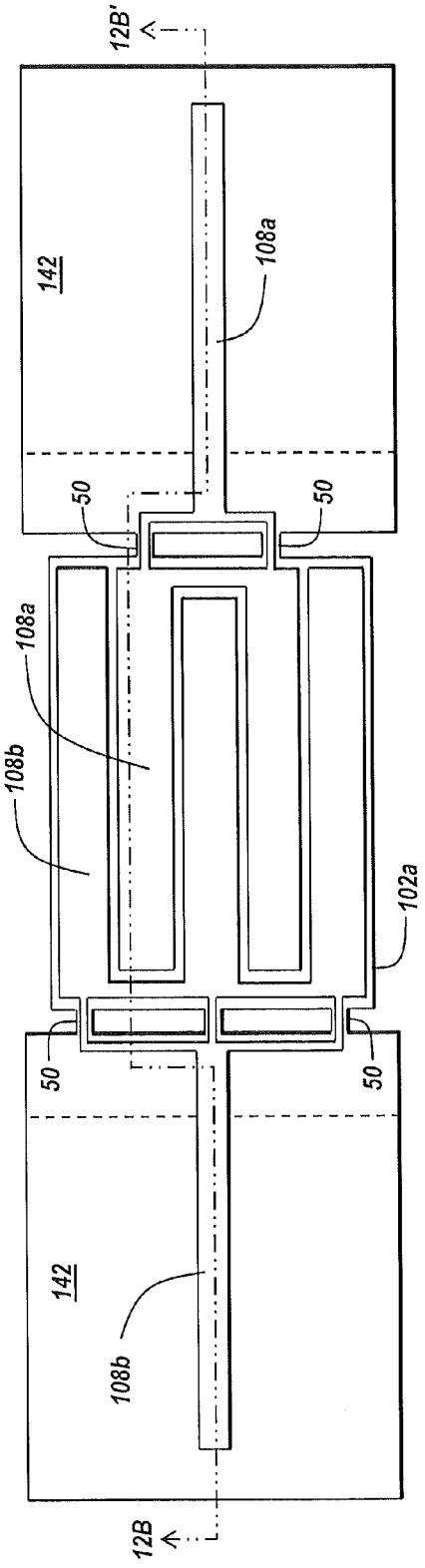
Fig. 12B
Fig. 12A

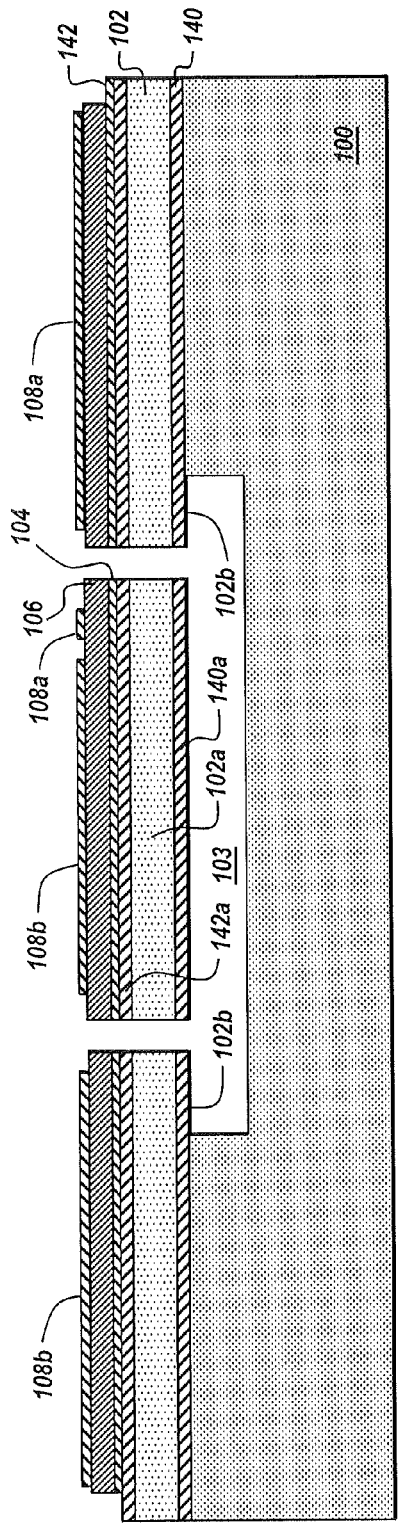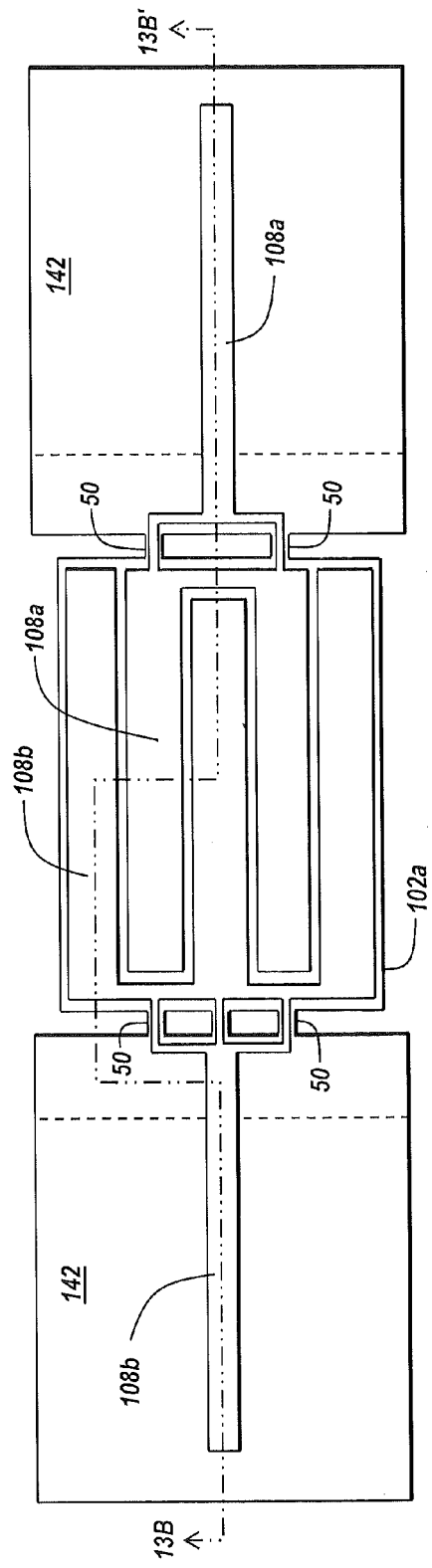
Fig. 13B
Fig. 13A

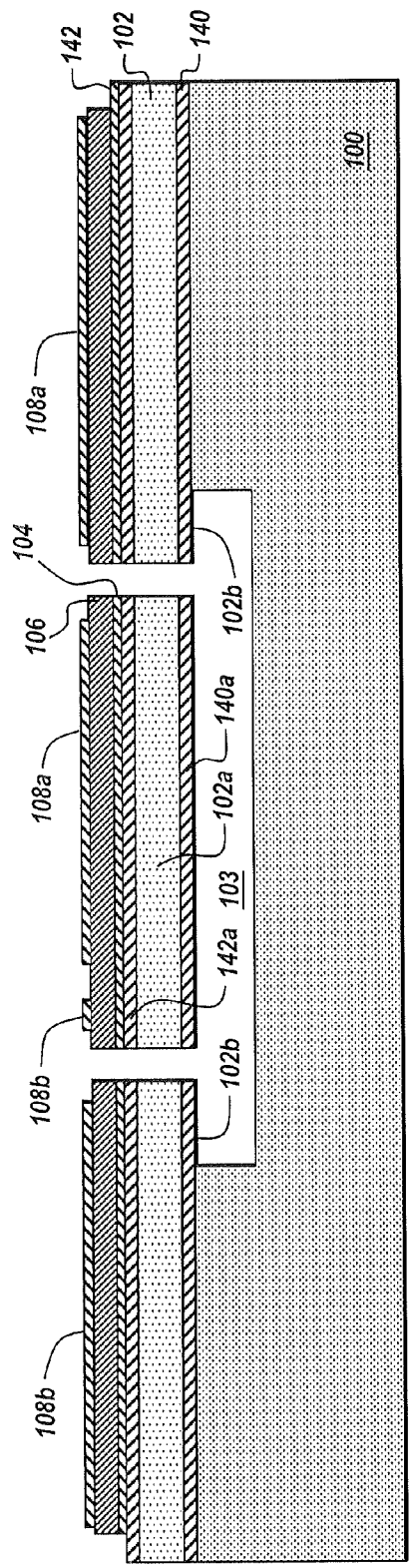
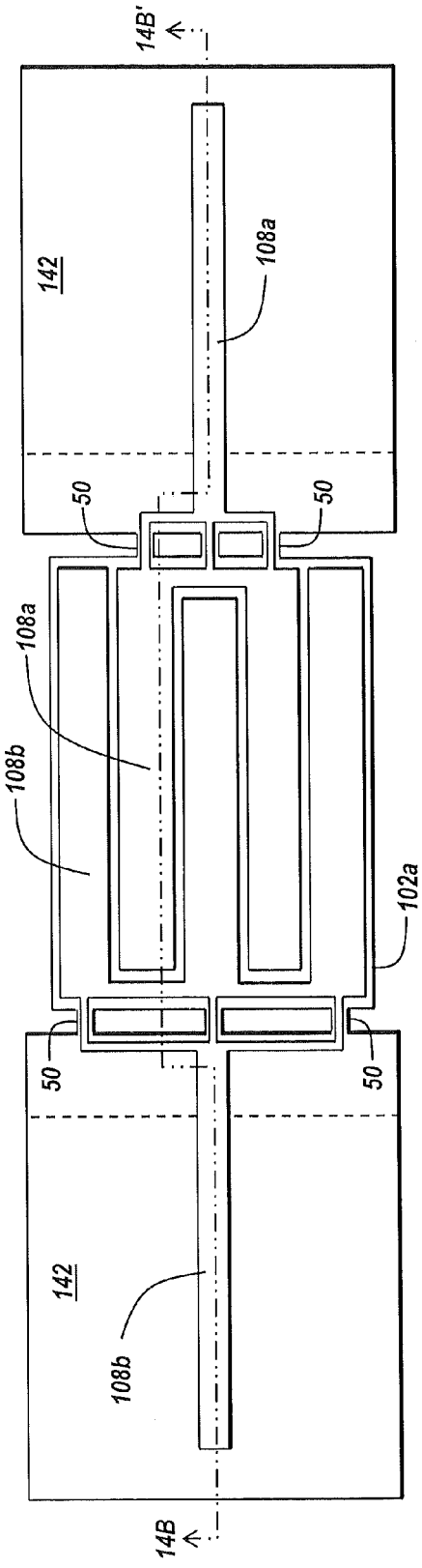
Fig. 14B
Fig. 14A

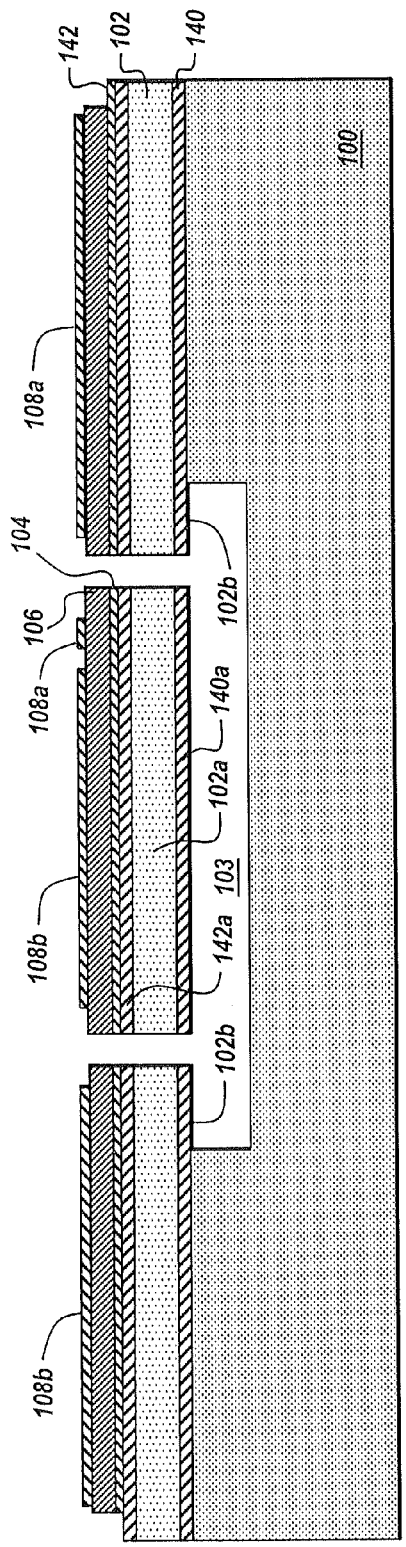
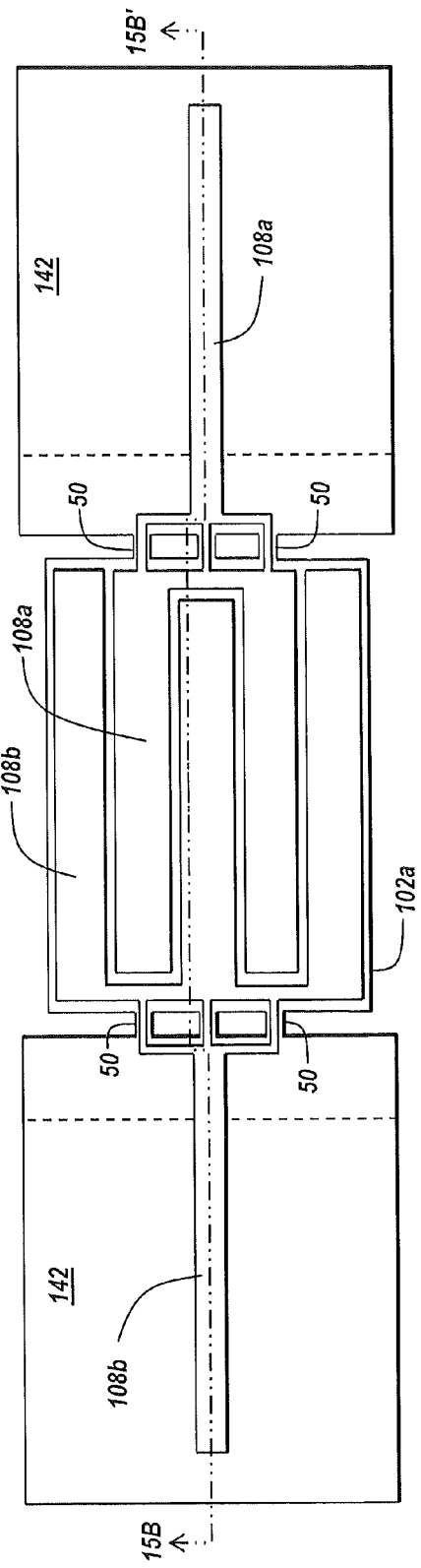
Fig. 15B
Fig. 15A

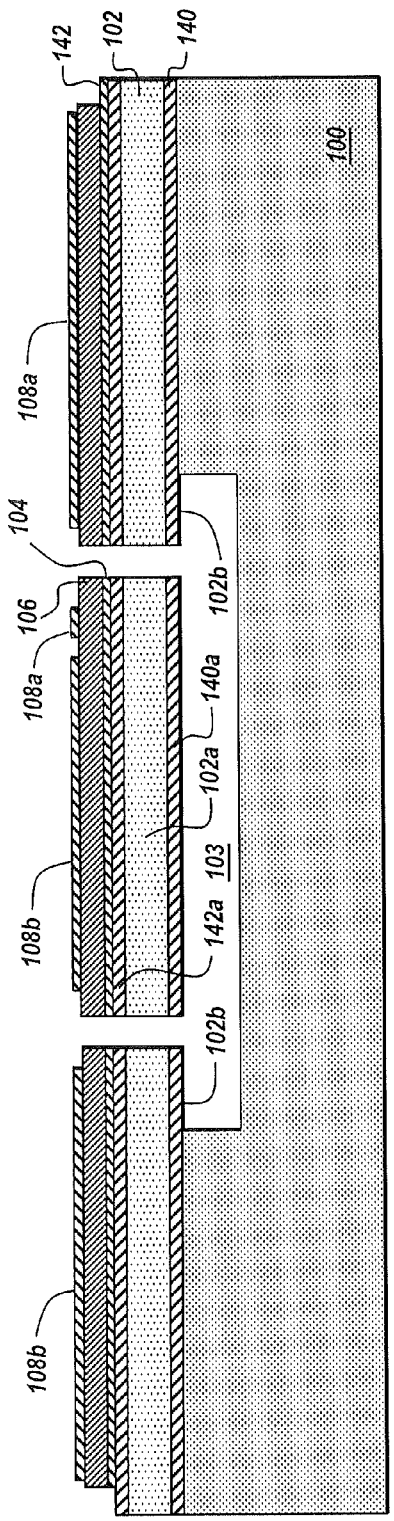
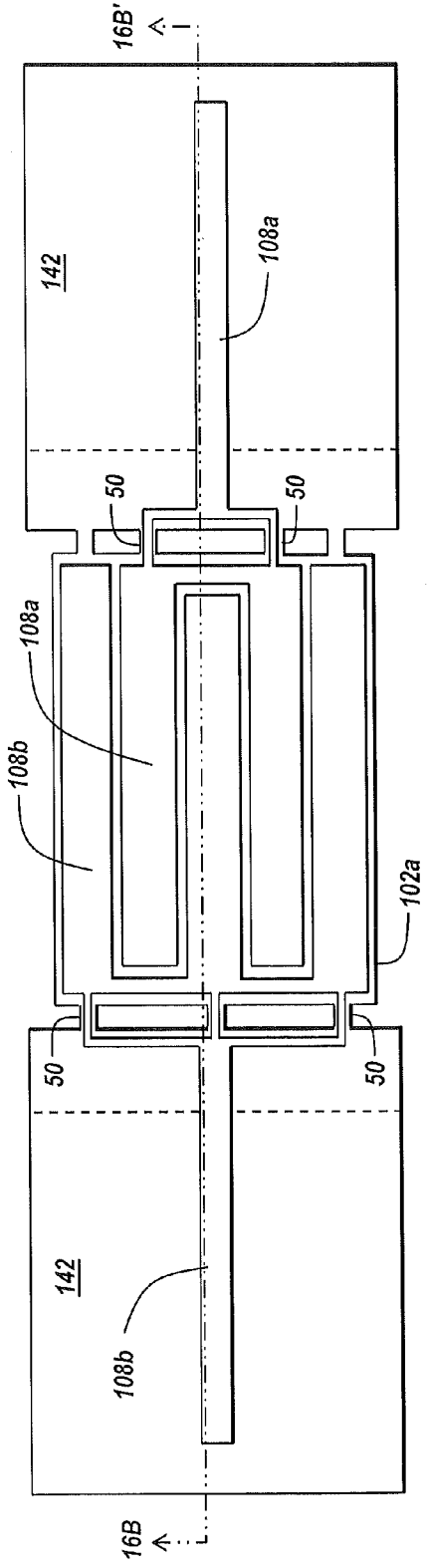
Fig. 16B
Fig. 16A

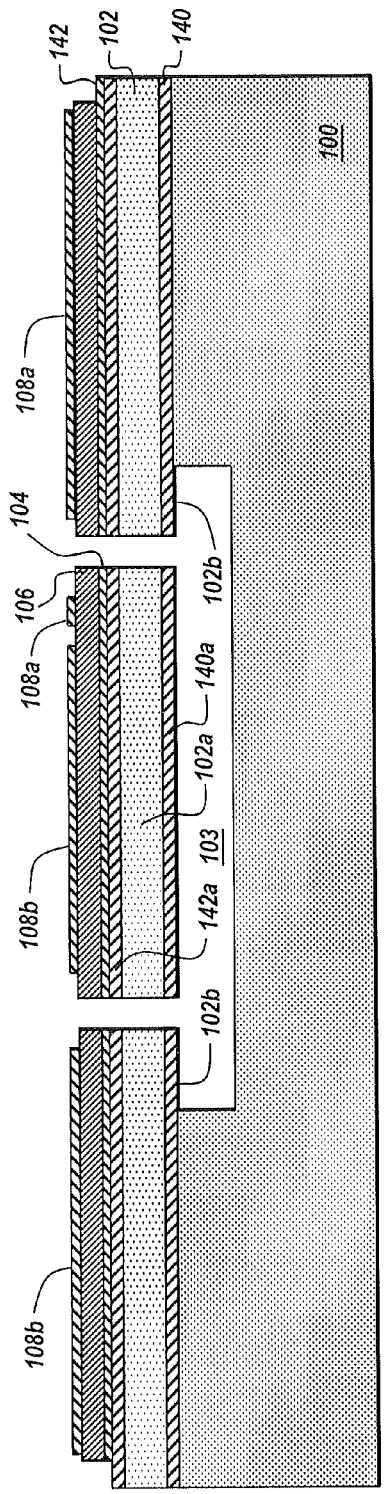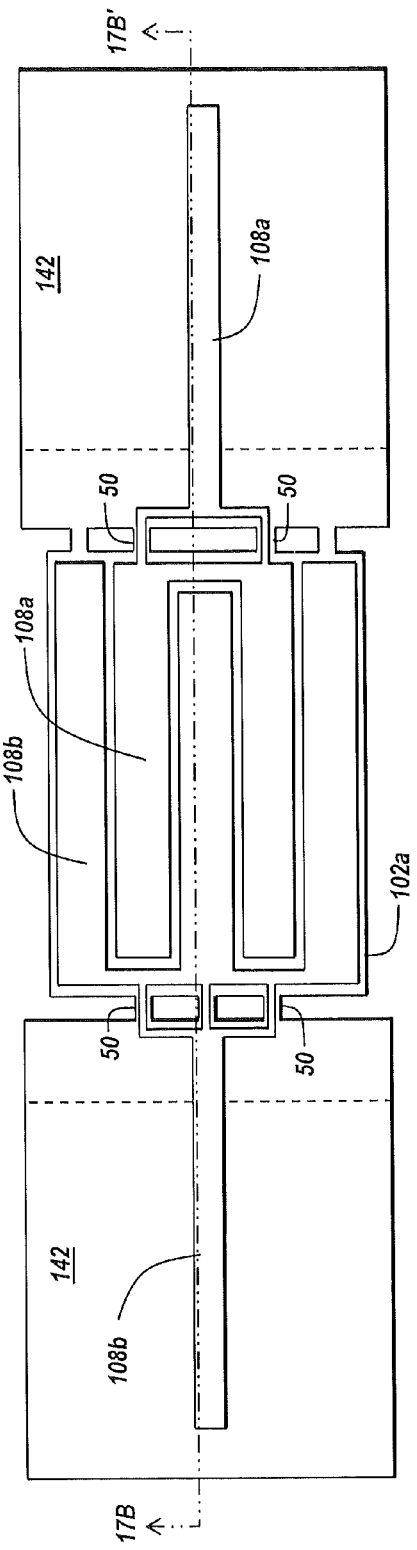
Fig. 17B
Fig. 17A

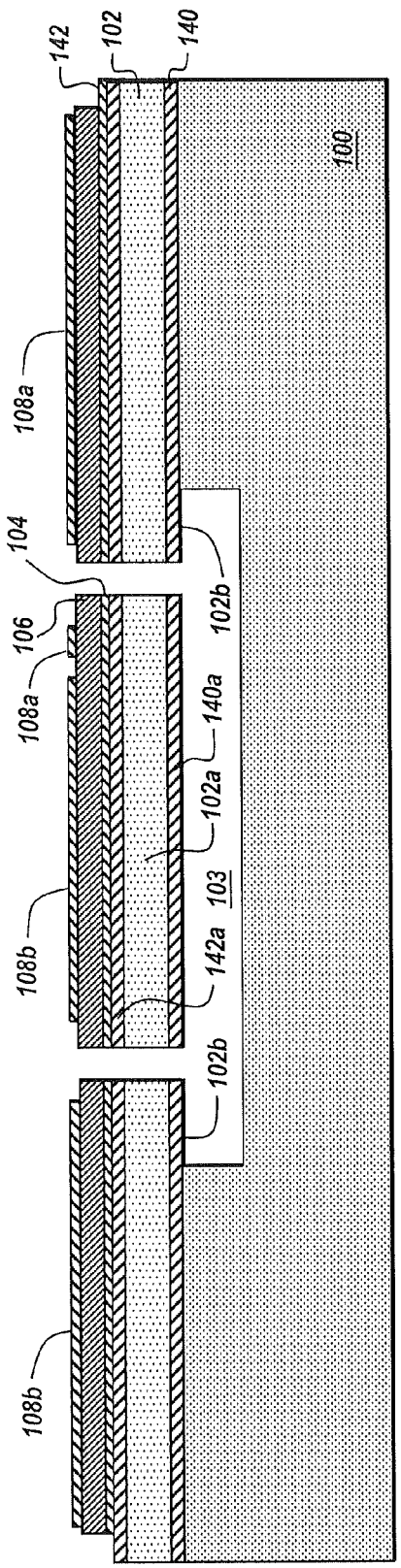
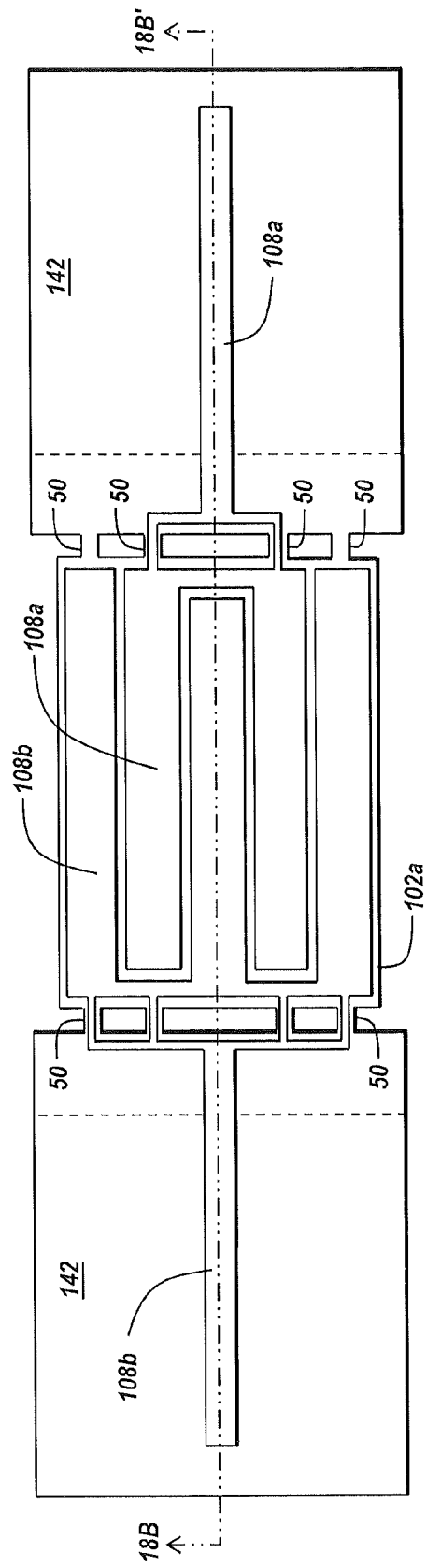
Fig. 18B
Fig. 18A

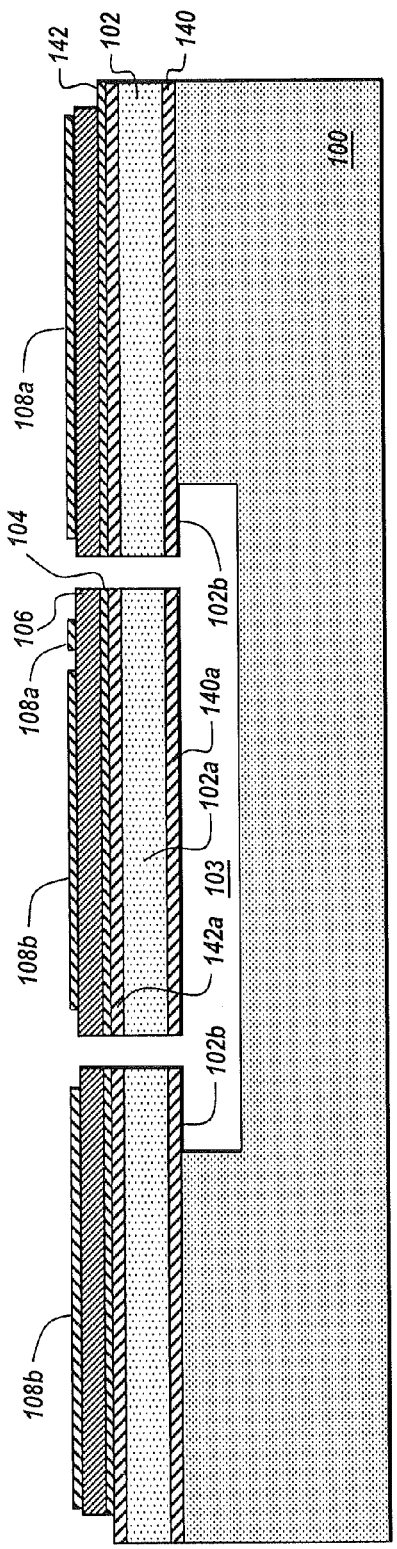
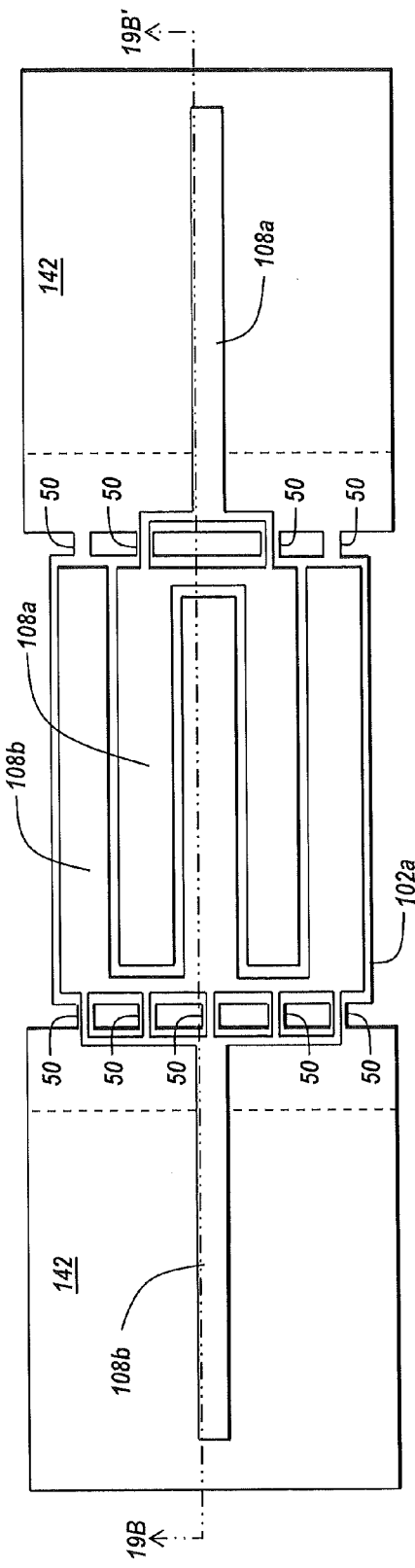
Fig. 19B
Fig. 19A

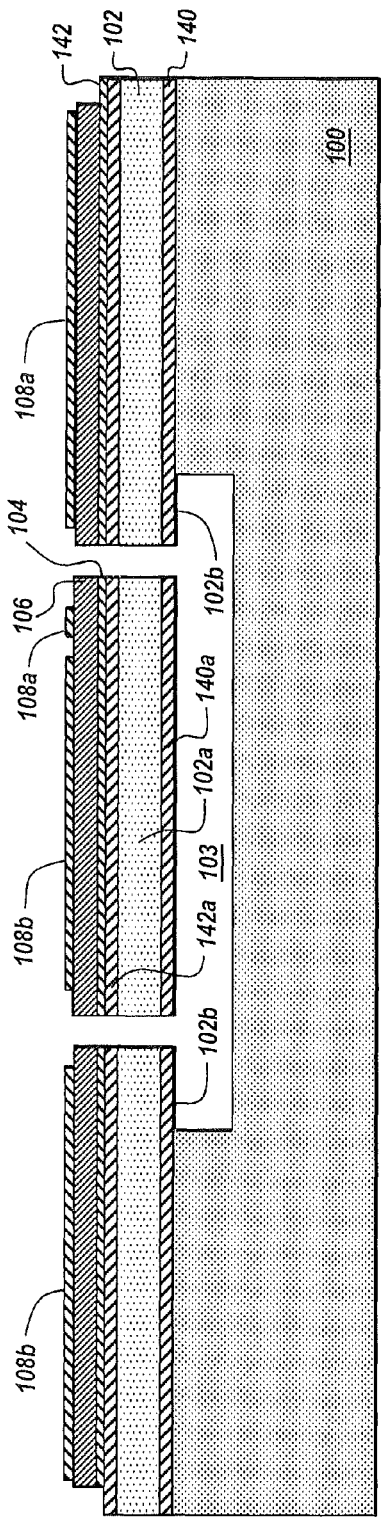
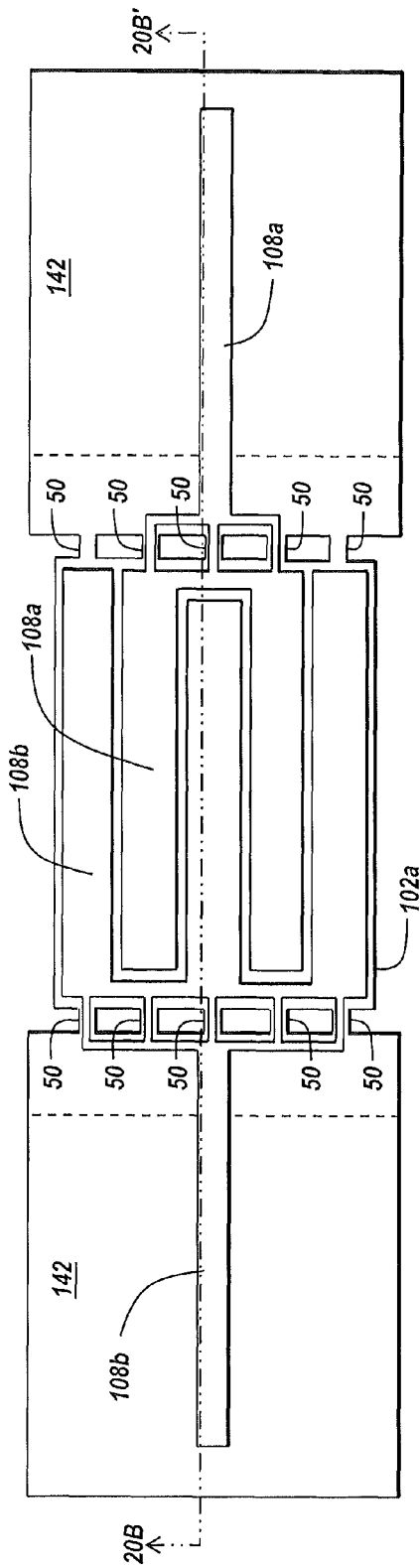
Fig. 20B
Fig. 20A

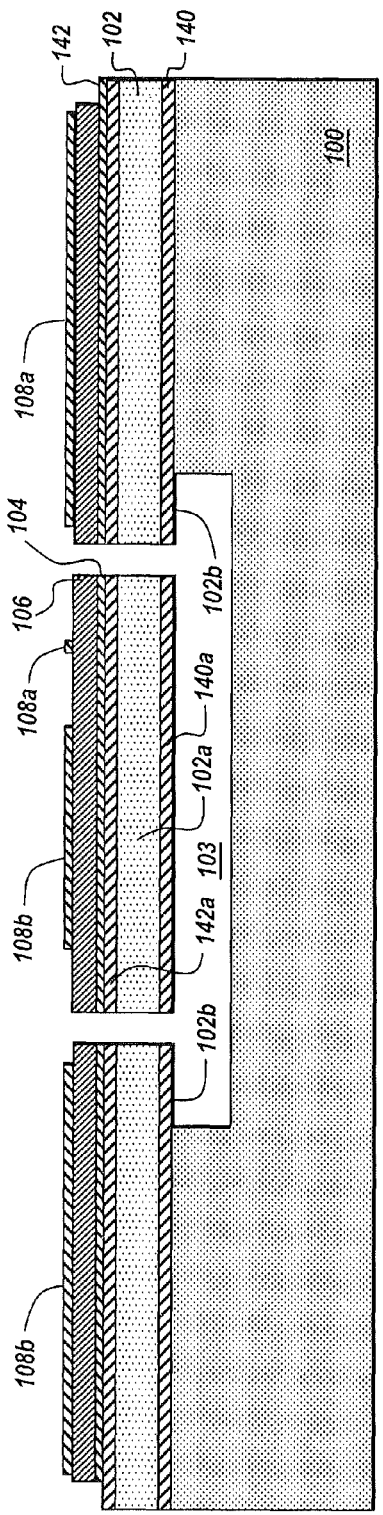
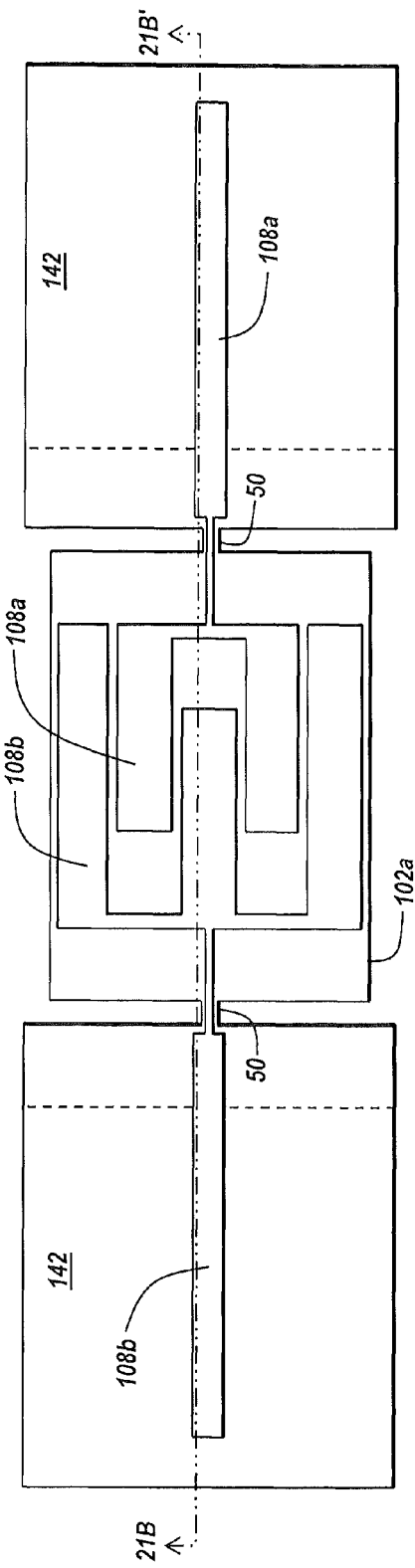
Fig. 21B
Fig. 21A

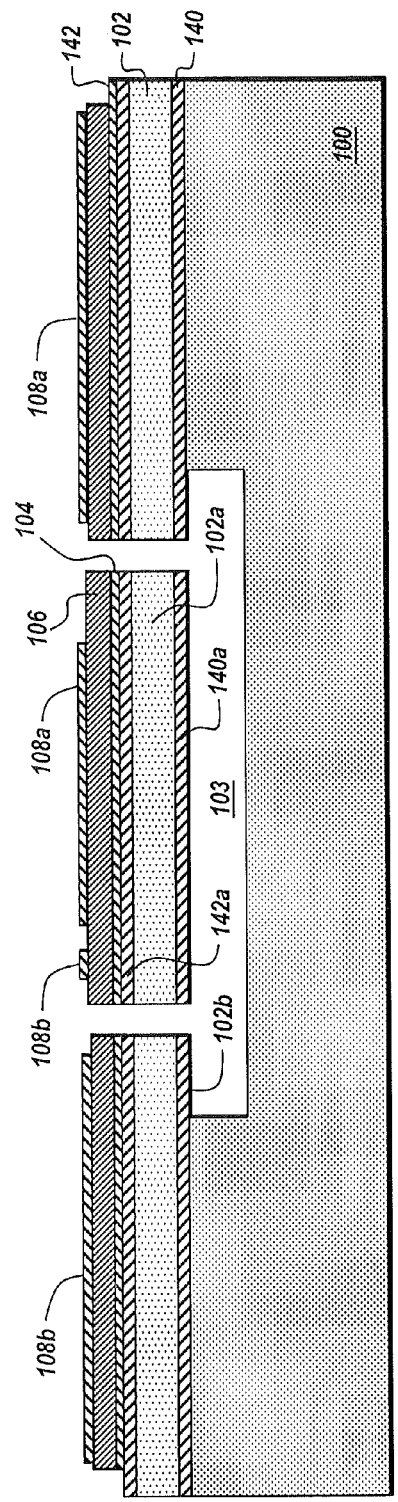
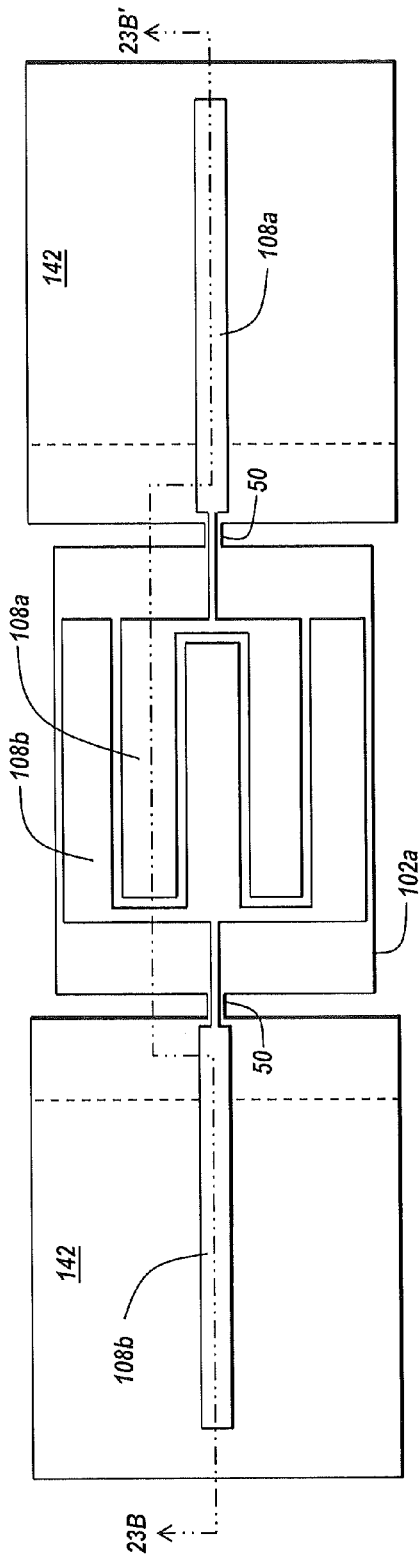
Fig. 23B
Fig. 23A

METHODS OF TESTING PACKAGED THIN-FILM PIEZOELECTRIC-ON-SEMICONDUCTOR MICROELECTROMECHANICAL RESONATORS HAVING HERMETIC SEALS

REFERENCE TO PRIORITY APPLICATION

This application is a continuation-in-part (CIP) of U.S. application Ser. No. 13/250,560, filed Sep. 30, 2011, entitled "Microelectromechanical Resonators Having Resistive Heating Elements Therein Configured to Provide Frequency Tuning Through Convective Heating of Resonator Bodies," the disclosure of which is hereby incorporated herein by reference.

FIELD OF THE INVENTION

The present invention relates to integrated circuit devices and, more particularly, to microelectromechanical resonator devices.

BACKGROUND OF THE INVENTION

Frequency references provided by oscillators are required in every clocked electronic system, including communication circuits, microprocessors, and signal processing circuits. Oscillators frequently consist of high performance piezoelectric crystals, such as quartz oscillators. The advantages of quartz oscillators are their stable operating frequency and high quality factor. However, the disadvantages of quartz oscillators are their relatively large size and unsuitability for high integration with electronic circuitry (e.g., CMOS circuits).

Based on these limitations of conventional oscillators, there is a strong interest in the development of fully integrated silicon oscillators. Integration is important not only for reduced size but also reduced power consumption. It is possible to realize an integrated silicon oscillator using the mechanical properties of silicon devices. For example, silicon microelectromechanical (MEMs) resonators can provide small form factor, ease of integration with conventional semiconductor fabrication techniques and high f●Q products. Accordingly, MEMs resonators are considered a desirable alternative to quartz resonators in real-time and other clock applications.

One example of a MEMs resonator includes lateral-mode piezoelectric resonators, such as thin-film piezoelectric-on-silicon (TPoS) resonators, which have been successfully incorporated into low-power and low-noise oscillators. FIG. 1 illustrates a conventional MEMs resonator 10 containing a resonator body 12 that is suspended opposite a recess in a substrate 16 by a pair of opposing tethers 14. This resonator body 12 may include a stack of multiple layers, including a semiconductor body, a bottom electrode on the semiconductor body, a piezoelectric layer on the bottom electrode and a plurality of top electrodes on the piezoelectric layer. The recess may be formed by selectively removing portions of a first substrate having an insulating layer thereon to define a trench therein. Thereafter, a semiconductor-on-insulator (SOI) substrate having a semiconductor device layer thereon is bonded to the insulating layer. Backside portions of the semiconductor-on-insulator (SOI) substrate are then removed to expose the semiconductor device layer, which extends on the insulating layer and the underlying first substrate having the trench therein. This semiconductor device layer is then patterned to define the suspended resonator body 10 at a location opposite the trench. Other examples of these types of resonators are disclosed in U.S. Pat. No. 7,939,990 to Wang et al., entitled "Thin-Film Bulk Acoustic Resonators Having Perforated Bodies That Provide Reduced Susceptibility to Process-Induced Lateral Dimension Variations," U.S. Pat. No. 7,888,843 to Ayazi et al., entitled "Thin-Film Piezoelectric-on-Insulator Resonators Having Perforated Resonator Bodies Therein," and in U.S. application Ser. No. 12/508,257, filed Jul. 23, 2009 to Ye Wang et al., entitled "Thin-Film Bulk Acoustic Resonators Having Perforated Resonator Body Supports that Enhance Quality Factor," now U.S. Pat. No. 8,106,724, the disclosures of which are hereby incorporated herein by reference.

Active frequency tuning techniques that include application of a DC voltage on the piezoelectric layer have been demonstrated, but such tuning typically requires relatively large voltages, which may be incompatible with the low operating voltages of conventional oscillator circuits. Some examples of active frequency tuning in micromechanical resonators are disclosed in U.S. Pat. Nos. 7,639,105 and 7,843,284 to Ayazi et al., entitled "Lithographically-Defined Multi-Standard Multi-Frequency High-Q Tunable Micromechanical Resonators," and in U.S. Pat. No. 7,924,119 to Ayazi et al., entitled Micromechanical Bulk Acoustic Mode Resonators Having Interdigitated Electrodes and Multiple Pairs of Anchor Supports," and in U.S. Pat. No. 7,800,282 to Ayazi et al., entitled Single-Resonator Dual-Frequency Lateral-Extension Mode Piezoelectric Oscillators, and Operating Methods Thereof," the disclosures of which are hereby incorporated herein by reference.

SUMMARY OF THE INVENTION

Methods of testing packaged thin-film piezoelectric-on-semiconductor (TPoS) microelectromechanical resonators having hermetic seals include measuring a quality factor (Q) of resonance of the resonator at at least two unequal temperatures to determine whether a $\Delta Q/\Delta T$ is different (e.g., by at least 50%) over a temperature range ($\Delta T$) spanning a smallest and largest of the at least two temperatures. These measurements are performed for a packaged resonator having a $Q_{AIR} < Q_{TED}$, where $Q_{AIR}$ is the quality factor of the packaged resonator due to air damping and $Q_{TED}$ is the quality factor of the packaged resonator due to thermoelastic damping. In particular, the packaged resonator can be configured so that $Q_{air} < (0.9) Q_{TED}$ at the smallest and largest of the at least two temperatures.

A microelectromechanical resonator according to further embodiments of the invention includes a substrate having a recess therein (e.g., pre-formed recess) and a resonator body suspended over the recess. The resonator body is anchored on opposing sides thereof to first and second portions of the substrate that extend over the recess as first and second ledges, respectively. A resistive heating element is provided in the substrate. This resistive heating element includes first and second resistive heating segments embedded in the first and second ledges, respectively. According to some of these embodiments of the invention, the resonator body may be anchored to the first and second ledges by first and second tethers, respectively, and the first and second resistive heating segments may be configured to heat the resonator body through conductive heating of the first and second tethers. In addition, the first and second resistive heating segments may extend entirely through the first and second ledges and may be configured to indirectly heat the resonator body through convective heating of the recess.

According to additional embodiments of the invention, the resistive heating element surrounds the resonator body on at least three sides thereof. For example, the substrate may include a frame-shaped ledge having four sides and the first and second ledges may be configured as opposing sides of the frame-shaped ledge. An energy source (e.g., voltage source, current source) may also be electrically coupled to first and second ends of the resistive heating element to thereby support a series current therein. The first and second ledges may also be formed to include first and second thermal isolation trenches therein that at least partially surround the first and second resistive heating segments.

According to still further embodiments of the invention, a microelectromechanical resonator is configured to include a resonator body, which anchored to a substrate by at least a pair of tethers that suspend the resonator body opposite an underlying recess in the substrate. A resistive heating element, which is configured to heat the resonator body through convective heating, is provided on a bottom of the recess. An electrical and thermal isolation layer (e.g., oxide or nitride layer) may also be provided between the resistive heating element and the bottom of the recess. The resistive heating element may be a serpentine-shaped resistive heating element. A thermal isolation trench may also be provided, which surrounds at least a portion of a terminal of the resistive heating element. The resonator may be further configured as a stack of layers, which includes a piezoelectric layer on the resonator body and at least one electrode on the piezoelectric layer. First and second electrical interconnects may also be provided, which extend through the resonator body layer and are electrically connected to respective first and second portions of the resistive heating element. These first and second electrical interconnects may be at least partially surrounded by respective first and second thermal and electrical isolation trenches, which extend through the resonator body layer.

According to additional embodiments of the invention, a microelectromechanical resonator may be configured to include a resonator body, which is encapsulated within a sealed cavity extending between first and second substrates that are bonded together. The resonator body is anchored to the first substrate by at least a pair of tethers that suspend the resonator body opposite an underlying recess in the first substrate, which shares an ambient with the sealed cavity. A resistive heating element (e.g., serpentine-shaped element) is also provided, which is configured to indirectly heat the resonator body through convective heating of the cavity. This resistive heating element may be disposed on an inner surface of the second substrate that is exposed to the cavity. In addition, an electrical and thermal isolation layer may be provided to extend between the resistive heating element and the inner surface of the second substrate. The resonator may also include first and second electrical interconnects, which extend through the second substrate and contact respective first and second portions of the resistive heating element. First and second contact pads, which are electrically connected to the first and second electrical interconnects, may also be provided on an outer surface of the second substrate.

BRIEF DESCRIPTION OF THE DRAWINGS

FIG. 2A is a plan view of a microelectromechanical bulk acoustic resonator containing a resistive heating element, according to an embodiment of the present invention.

FIG. 2B is a cross-sectional view of the resonator of FIG. 2A, taken along line 2B-2B'.

FIG. 3A is a plan view of a microelectromechanical bulk acoustic resonator containing a resistive heating element, according to an embodiment of the present invention.

FIG. 3B is a cross-sectional view of the resonator of FIG. 3A, taken along line 3B-3B'.

FIGS. 4A-4F are cross-sectional views of intermediate structures that illustrate methods of forming a microelectromechanical bulk acoustic resonator with resistive heating element, according to an embodiment of the invention.

FIG. 4G is a plan view of the structure of FIG. 4F with the suspended resonator body omitted to highlight a serpentine shape of a resistive heating element, according to an embodiment of the invention.

FIG. 7A is a plan view of a microelectromechanical bulk acoustic resonator that utilizes materials with positive temperature coefficients of frequency to achieve passive temperature compensation, according to an embodiment of the present invention.

FIG. 7B is a cross-sectional view of the microelectromechanical bulk acoustic resonator of FIG. 7A, taken along line 7B-7B'.

FIG. 8A is a plan view of a microelectromechanical bulk acoustic resonator that utilizes materials with positive temperature coefficients of frequency to achieve passive temperature compensation, according to an embodiment of the present invention.

FIG. 8B is a cross-sectional view of the microelectromechanical bulk acoustic resonator of FIG. 8A, taken along line 8B-8B'.

FIG. 9A is a plan view of a microelectromechanical bulk acoustic resonator that utilizes materials with positive temperature coefficients of frequency to achieve passive temperature compensation, according to an embodiment of the present invention.

FIG. 9B is a cross-sectional view of the microelectromechanical bulk acoustic resonator of FIG. 9A, taken along line 9B-9B'.

FIG. 10A is a plan view of a microelectromechanical bulk acoustic resonator that utilizes materials with positive temperature coefficients of frequency to achieve passive temperature compensation, according to an embodiment of the present invention.

FIG. 10B is a cross-sectional view of the microelectromechanical bulk acoustic resonator of FIG. 10A, taken along line 10B-10B'.

FIG. 11A is a plan view of a microelectromechanical bulk acoustic resonator that utilizes materials with positive temperature coefficients of frequency to achieve passive temperature compensation, according to an embodiment of the present invention.

FIG. 11B is a cross-sectional view of the microelectromechanical bulk acoustic resonator of FIG. 11A, taken along line 11B-1B'.

FIG. 12A is a plan view of a microelectromechanical bulk acoustic resonator that utilizes materials with positive temperature coefficients of frequency to achieve passive temperature compensation, according to an embodiment of the present invention.

FIG. 12B is a cross-sectional view of the microelectromechanical bulk acoustic resonator of FIG. 12A, taken along line 12B-12B'.

FIG. 13A is a plan view of a microelectromechanical bulk acoustic resonator that utilizes materials with positive temperature coefficients of frequency to achieve passive temperature compensation, according to an embodiment of the present invention.

FIG. 13B is a cross-sectional view of the microelectromechanical bulk acoustic resonator of FIG. 13A, taken along line 13B-13B'.

FIG. 14A is a plan view of a microelectromechanical bulk acoustic resonator that utilizes materials with positive temperature coefficients of frequency to achieve passive temperature compensation, according to an embodiment of the present invention.

FIG. 14B is a cross-sectional view of the microelectromechanical bulk acoustic resonator of FIG. 14A, taken along line 14B-14B'.

FIG. 15A is a plan view of a microelectromechanical bulk acoustic resonator that utilizes materials with positive temperature coefficients of frequency to achieve passive temperature compensation, according to an embodiment of the present invention.

FIG. 15B is a cross-sectional view of the microelectromechanical bulk acoustic resonator of FIG. 15A, taken along line 15B-15B'.

FIG. 16A is a plan view of a microelectromechanical bulk acoustic resonator that utilizes materials with positive temperature coefficients of frequency to achieve passive temperature compensation, according to an embodiment of the present invention.

FIG. 16B is a cross-sectional view of the microelectromechanical bulk acoustic resonator of FIG. 16A, taken along line 16B-16B'.

FIG. 17A is a plan view of a microelectromechanical bulk acoustic resonator that utilizes materials with positive temperature coefficients of frequency to achieve passive temperature compensation, according to an embodiment of the present invention.

FIG. 17B is a cross-sectional view of the microelectromechanical bulk acoustic resonator of FIG. 17A, taken along line 17B-17B'.

FIG. 18A is a plan view of a microelectromechanical bulk acoustic resonator that utilizes materials with positive temperature coefficients of frequency to achieve passive temperature compensation, according to an embodiment of the present invention.

FIG. 18B is a cross-sectional view of the microelectromechanical bulk acoustic resonator of FIG. 18A, taken along line 18B-18B'.

FIG. 19A is a plan view of a microelectromechanical bulk acoustic resonator that utilizes materials with positive temperature coefficients of frequency to achieve passive temperature compensation, according to an embodiment of the present invention.

FIG. 19B is a cross-sectional view of the microelectromechanical bulk acoustic resonator of FIG. 19A, taken along line 19B-19B'.

FIG. 20A is a plan view of a microelectromechanical bulk acoustic resonator that utilizes materials with positive temperature coefficients of frequency to achieve passive temperature compensation, according to an embodiment of the present invention.

FIG. 20B is a cross-sectional view of the microelectromechanical bulk acoustic resonator of FIG. 20, taken along line 20B-20B'.

FIG. 21A is a plan view of a microelectromechanical bulk acoustic resonator that utilizes materials with positive temperature coefficients of frequency to achieve passive temperature compensation, according to an embodiment of the present invention.

FIG. 21B is a cross-sectional view of the microelectromechanical bulk acoustic resonator of FIG. 21A, taken along line 21B-21B'.

FIG. 23A is a plan view of a microelectromechanical bulk acoustic resonator that utilizes materials with positive temperature coefficients of frequency to achieve passive temperature compensation, according to an embodiment of the present invention.

FIG. 23B is a cross-sectional view of the microelectromechanical bulk acoustic resonator of FIG. 23A, taken along line 23B-23B'.

DETAILED DESCRIPTION OF EMBODIMENTS

Figure 1:
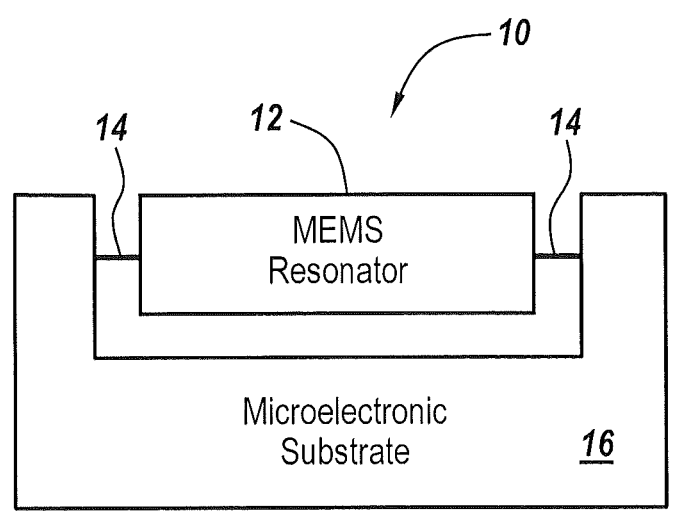
FIG. 1 is a cross-sectional schematic of a conventional microelectromechanical resonator.

The present invention now will be described more fully with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout.

It will be understood that when an element or layer is referred to as being "on," "connected to" or "coupled to" another element or layer (and variants thereof), it can be directly on, connected or coupled to the other element or layer or intervening elements or layers may be present. In contrast, when an element is referred to as being "directly on," "directly connected to" or "directly coupled to" another element or layer (and variants thereof), there are no intervening elements or layers present. Like reference numerals refer to like elements throughout.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprising", "including", having" and variants thereof, when used in this specification, specify the presence of stated features, steps, operations, elements, and/or components, but do not preclude the presence or addition of one or more other features, steps, operations, elements, components, and/or groups thereof. In contrast, the term "consisting of" when used in this specification, specifies the stated features, steps, operations, elements, and/or components, and precludes additional features, steps, operations, elements and/or components.

Embodiments of the present invention are described herein with reference to cross-section and perspective illustrations that are schematic illustrations of idealized embodiments (and intermediate structures) of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a sharp angle may be somewhat rounded due to manufacturing techniques/tolerances.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIGS. 2A-2B illustrate an embodiment of a microelectromechanical resonator formed on a substrate having a recess 103 therein. The substrate is illustrated as containing a substrate body 100 (e.g., semiconductor chip) having a resonator body layer 102 thereon, from which a resonator body 102a (e.g., rectangular monocrystalline silicon body) is patterned and suspended opposite the recess 103. As described more fully hereinbelow, this recess 103 may be defined in a surface of the substrate body 100 in advance of bonding the resonator body layer 102 to the surface. This resonator body 102a may be anchored to the substrate (e.g., surrounding portions of the resonator body layer 102) by one or more pairs of tethers (e.g., first and second tethers extending from opposing sides of the resonator body). The resonator body layer 102 may also include ledges 102b that extend over the underlying recess 103 having sidewalls that are recessed relative to sidewalls of the corresponding ledges 102b.

The resonator may include a composite stack of the suspended resonator body 102a, a bottom electrode 104 on the resonator body 102a, a piezoelectric layer 106 on the bottom electrode 104 and at least a pair of electrodes 108a, 108b on the piezoelectric layer 106. In some embodiments of the invention, the electrodes 108a, 108b may include interdigitated fingers as illustrated by FIG. 2A. Although not shown in FIGS. 2A-2B, the resonator may further include one or more temperature compensation layers, such as silicon dioxide layers, within the composite stack and one or more perforations (filled or unfilled) within the resonator body 102a. These and other aspects of the resonator may be as disclosed in commonly assigned U.S. application Ser. Nos. 12/363,142, filed Jan. 30, 2009, entitled "Thin-Film Bulk Acoustic Resonators Having Reduced Susceptibility to Process-Induced Material Thickness Variations," and 12/508,257, filed Jul. 23, 2009, entitled "Thin-Film Bulk Acoustic Resonators Having Perforated Resonator Body Supports that Enhance Quality Factor," the disclosures of which are hereby incorporated herein by reference.

The resonator embodiment of FIGS. 2A-2B further includes a resistive heating element 110 embedded in the ledges 102b of the resonator body layer 102. This resistive heating element 110 may be formed as a polysilicon or tungsten (W) heating element having a sufficiently low resistance, for example, however, other materials preferably having resistivities in a range from about $10^{-8}$ $\Omega$m to about 100 $\Omega$m. Output terminals of a controllable energy source, such as a voltage source (V) or a current source (not shown), are applied to a pair of contact pads 110a, 110b so that a "frequency tuning" current may be established in the resistive heating element 110, which is configured to heat the resonator body 102a by conductive heating of the first and second tethers and further indirectly heat the resonator body 102a through convective heating of the ambient (e.g., air, nitrogen gas) in the underlying recess 103.

As illustrated by FIG. 2A, the resistive heating element 110 may be embedded as a square ring-shaped element in a four-sided frame-shaped ledge that overhangs the recess 103 and may thereby surround the resonator body 102a on at least three sides thereof. Alternatively, as illustrated by FIGS. 3A-3B, a resistive heating element may be embodied as first and second resistive heating segments 110' that are at least partially surrounded by a respective one of the first and second thermal isolation trenches 115, which are illustrated as extending entirely through the corresponding ledges 102b.

Figure 4A:
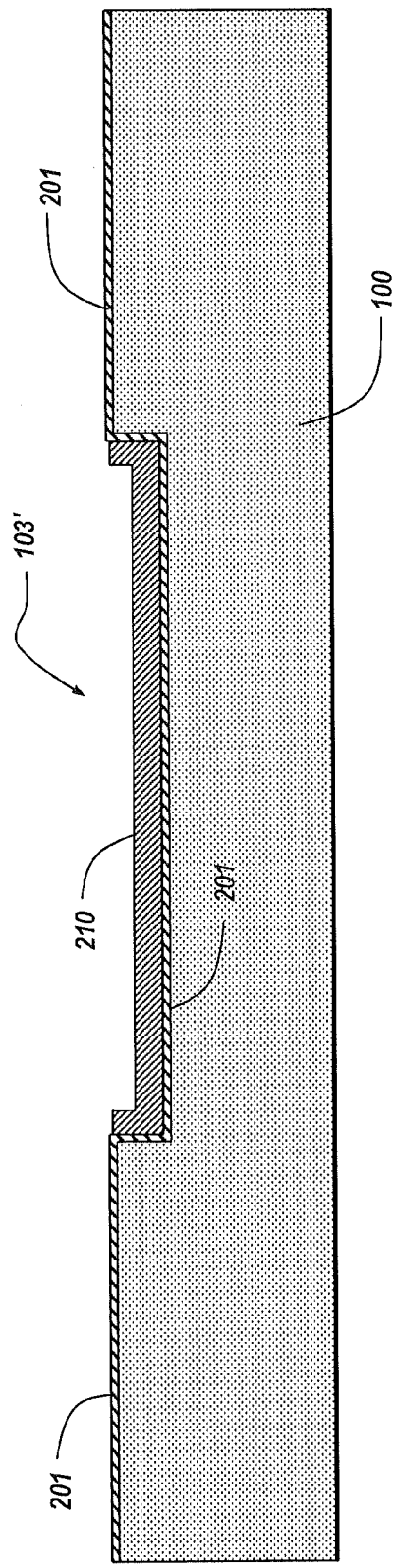

Referring now to FIGS. 4A-4G, methods of forming a microelectromechanical bulk acoustic resonators with resistive heating elements will be described. As illustrated by FIG. 4A, a substrate 100 (e.g., silicon wafer) may be provided having a recess/trench 103' therein, adjacent an upper surface thereof. A conformal deposition step may performed to line a bottom and sidewalls of the recess 103' and the upper surface of the substrate 100 within an electrically and thermally insulating oxide or nitride layer 201 (optional). Thereafter, a resistive heating material (e.g., doped/undoped polysilicon, tungsten (W)) may be deposited into the recess 103' and photolithographically patterned to define a resistive heating element 210. As described and illustrated more fully hereinbelow with respect to FIGS. 4F-4G, the resistive heating element 210 may be patterned as a serpentine-shaped heating element that can convectively heat the resonator body 102a.

Figure 4B:
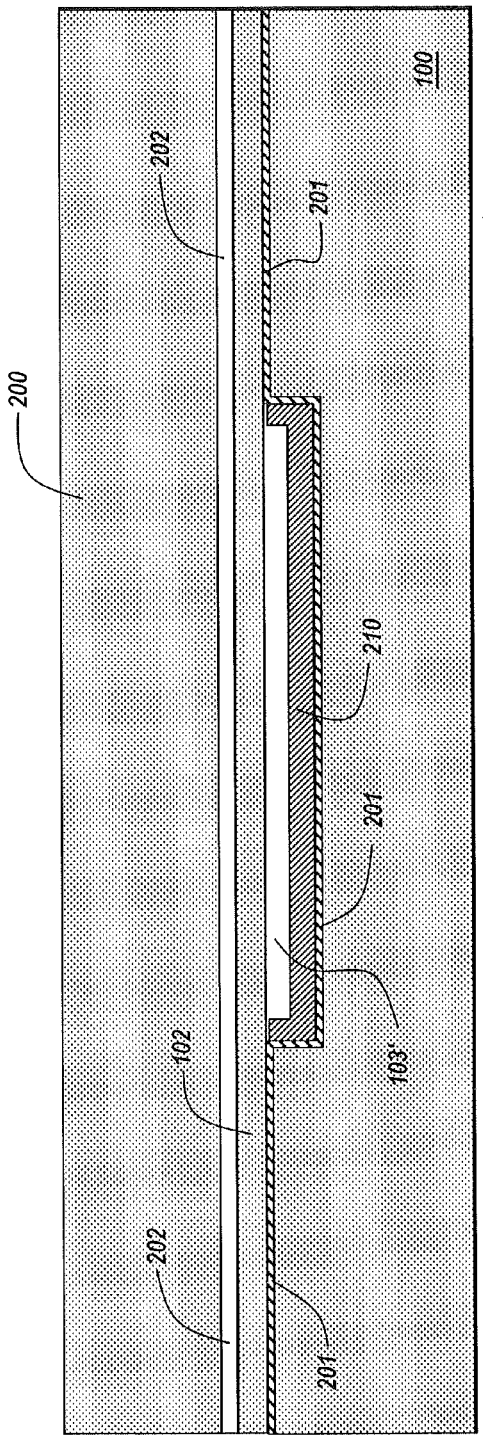
Figure 4C:
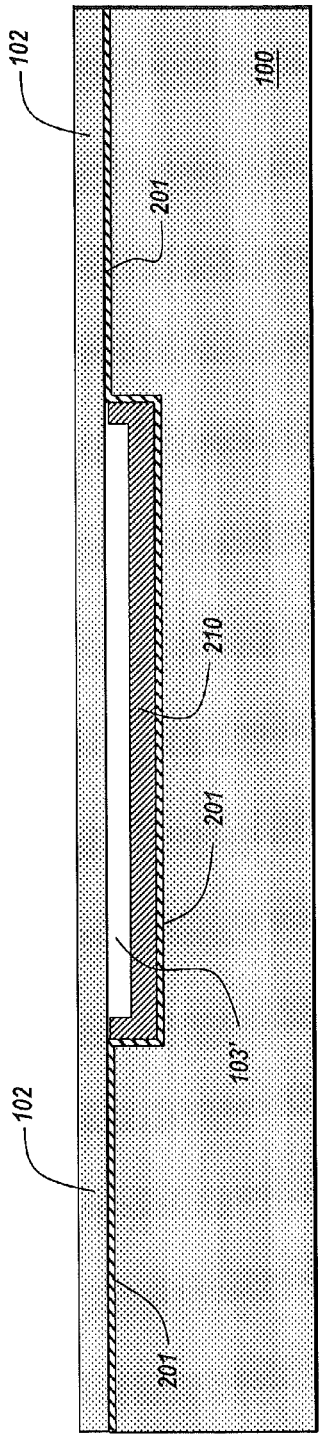

FIG. 4B illustrates the bonding of the electrically and thermally insulating layer 201 to a resonator body layer 102. This step may be performed by bonding the electrically and thermally insulating layer 201 to a semiconductor-on-insulator (SOI) substrate, which includes a resonator body layer 102, a sacrificial insulating layer 202 (e.g., oxide layer) and a handling substrate 200 (e.g., silicon wafer). As illustrated by FIG. 4C, the handling substrate 200 and the sacrificial insulating layer 202 may be removed to expose the resonator body layer 102 using, for example, a sequence of a wafer grinding step and a chemical mechanical polishing (CMP) step to remove the handling substrate 200 and a wet etching step to remove the sacrificial insulating layer 202 without damaging the resonator body layer 102.

Figure 4D:
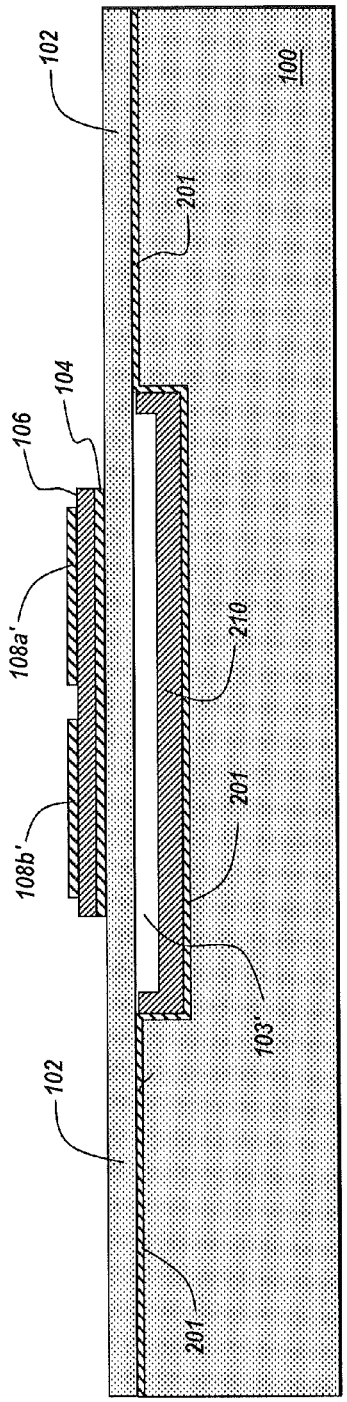
Figure 4E:
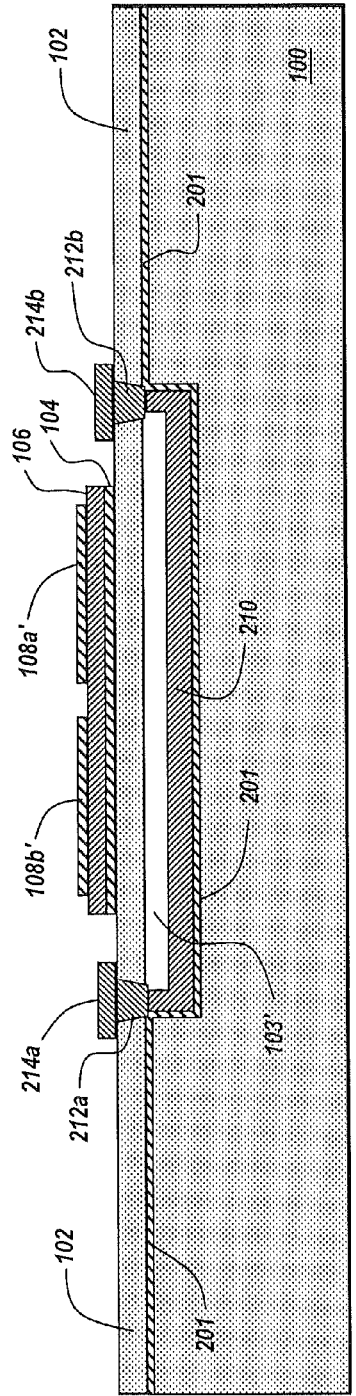

FIG. 4D illustrates the formation (e.g., deposition and patterning) of a stack of layers on the resonator body layer 102. This stack includes a bottom electrode 104 (e.g., molybdenum (Mo)), a piezoelectric layer 106 (e.g., AlN) on the bottom electrode 104 and at least a pair of electrodes 108a', 108b' on the piezoelectric layer 106. FIG. 4E illustrates the formation of first and second electrical interconnects 212a, 212b on underlying portions of the resistive heating element 210 (e.g., on opposing ends of a serpentine-shaped heating element) and the formation of contact pads 214a, 214b on the electrical interconnects 212a, 212b. The formation of the first and second electrical interconnects 212a, 212b may be preceded by the formation of openings/vias in the resonator body layer 102, which are then filled with the material of the electrical interconnects 212a, 212b. The electrical interconnects 212a, 212b may be formed of a material having a higher electrical conductivity relative to the material of the resistive heating element 210. In addition, the electrical interconnects 212a, 212b are preferably formed using materials that require relatively low temperature processing (e.g., back-end processing), which will not damage the previously formed materials of the resonator.

As shown by FIG. 4F, deep trenches are etched through the resonator body layer 102 to: (i) define a suspended resonator body 102a, which is anchored opposite the recess 103' by at least a pair of tethers to surrounding portions of the resonator body layer 102; and (ii) define thermal and electrical isolation trenches 115, which substantially surround corresponding electrical interconnects 212a, 212b. As highlighted by the upward directed arrows in the recess 103', the passing of a current through the resistive heating element 210 causes convective heating of the ambient (e.g., air, nitrogen gas) in the recess 103' during resonant operation of the resonator. This current may be controlled to thereby adjust a temperature of the resonator and its resonant frequency.

Figure 5A:
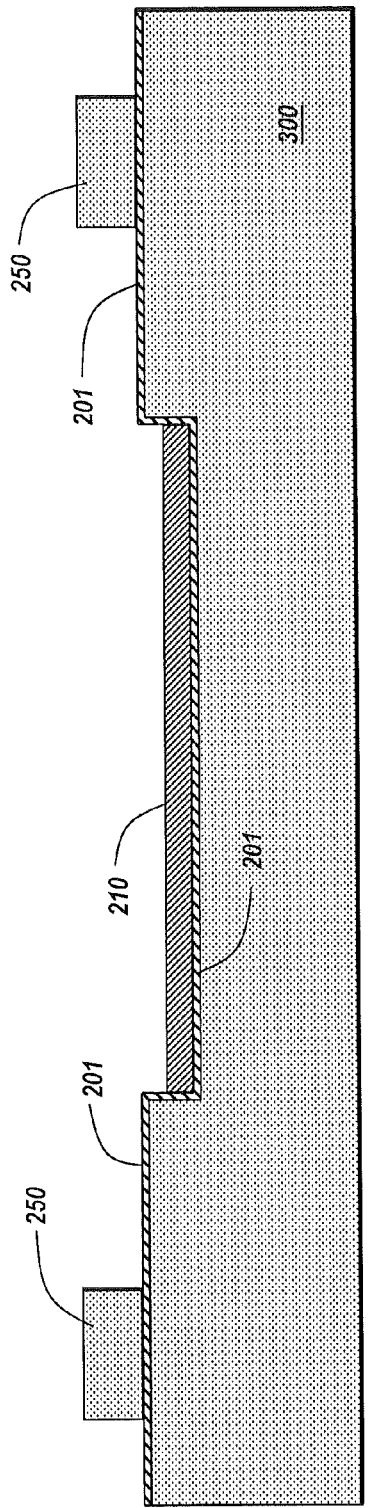
FIGS. 5A-5C are cross-sectional views of intermediate structures that illustrate methods of forming a packaged microelectromechanical bulk acoustic resonator with a resistive heating element, according to an embodiment of the invention.
Figure 5B:
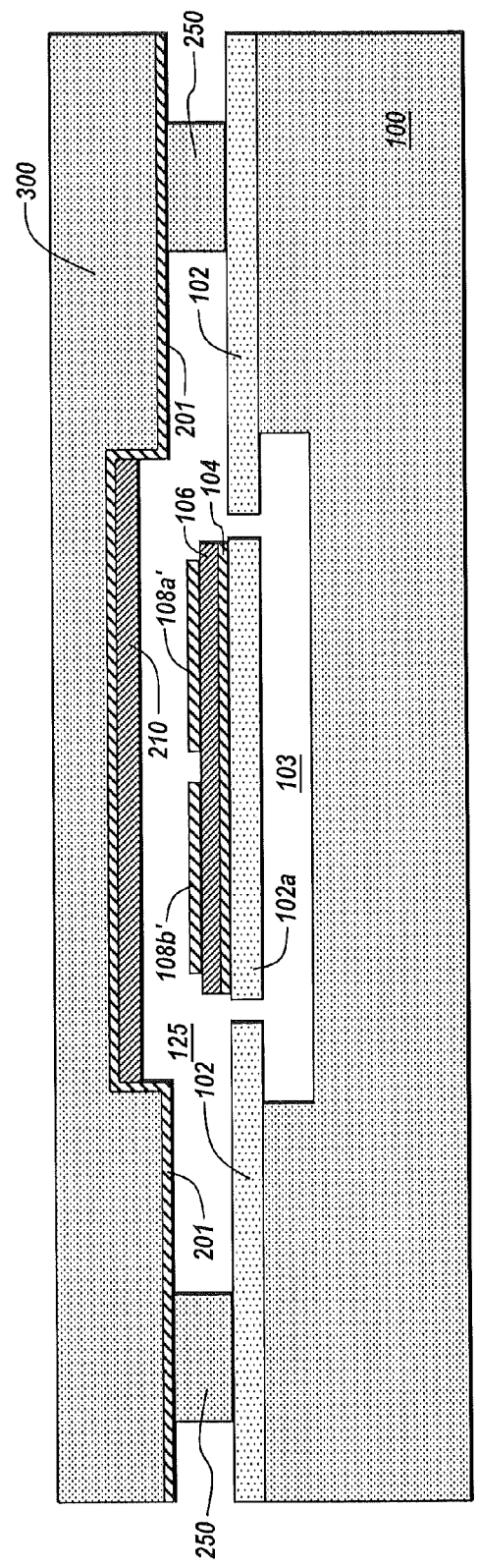
Figure 5C:
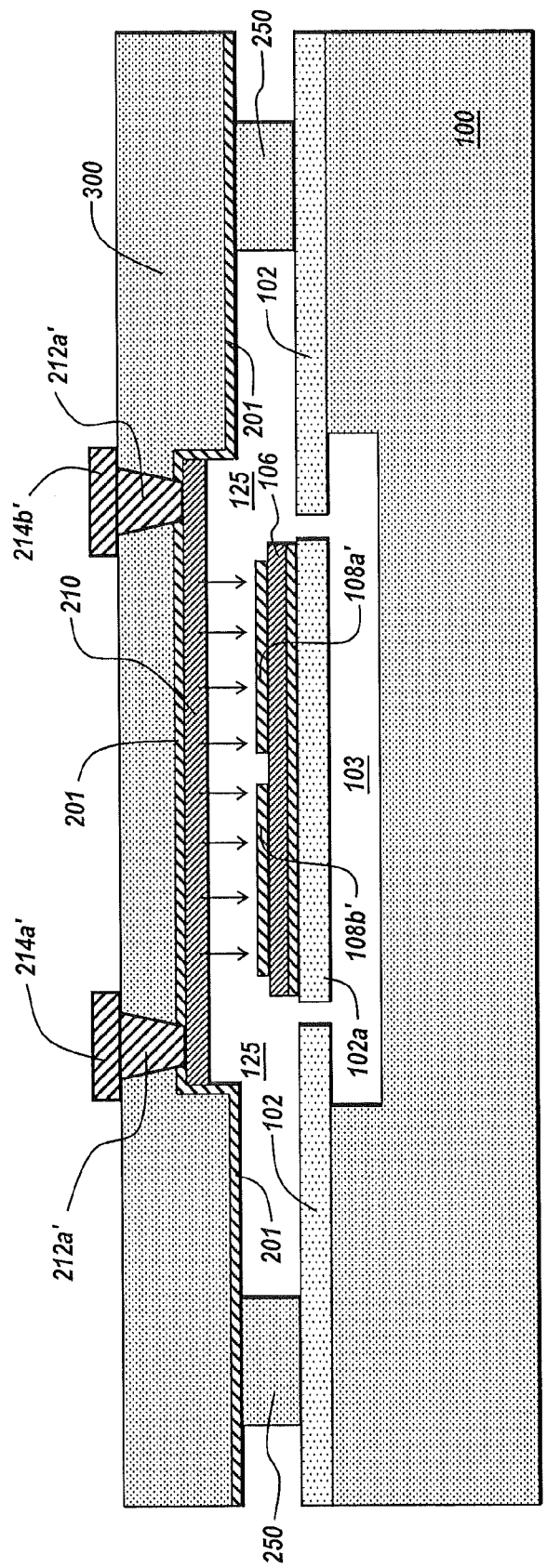

Referring now to FIGS. 5A-5C, methods of forming a packaged microelectromechanical bulk acoustic resonator may include forming a recess in a surface of a capping substrate 300 (e.g., silicon substrate) and then lining the recess and the surface of the capping substrate with an electrically and thermally insulating layer 201, as illustrated by FIG. 5A. Thereafter, a resistive heating element 210 (e.g., a serpentine-shaped element) may be formed on the insulating layer 201 within the recess. A bonding material may also be deposited onto the insulating layer 201 and then patterned to define a bonding pattern 250 (e.g., ring-shaped bonding pattern). Thereafter as illustrated by FIG. 5B and described more fully in commonly assigned U.S. Pat. No. 7,995,885 to Bhugra et al., entitled "Methods of Forming Packaged Micro-Electromechanical Devices," which is hereby incorporated herein by reference, a substrate 100 containing a resonator body layer 102 associated with a suspended microelectromechanical resonator may be bonded to the bonding pattern 250 to thereby define a sealed cavity 125 (e.g., a hermetically sealed cavity), which shares an ambient with the recess 103.

Referring now to FIG. 5C, a selective etching step may be performed to define contact openings/vias in the capping substrate 300, which expose respective portions of the resistive heating element 210. First and second electrical interconnects 212a', 212b' may then be formed in the contact openings, as illustrated, and then contact pads 214a', 214b' may be formed on the interconnects 212a', 212b'. As described above with respect to FIG. 4F, and highlighted by the downward directed arrows, the passing of a externally controlled current through the resistive heating element 210 causes convective heating of the ambient (e.g., air, nitrogen gas) in the sealed cavity 125 during resonant operation of the resonator.

Figure 6A:
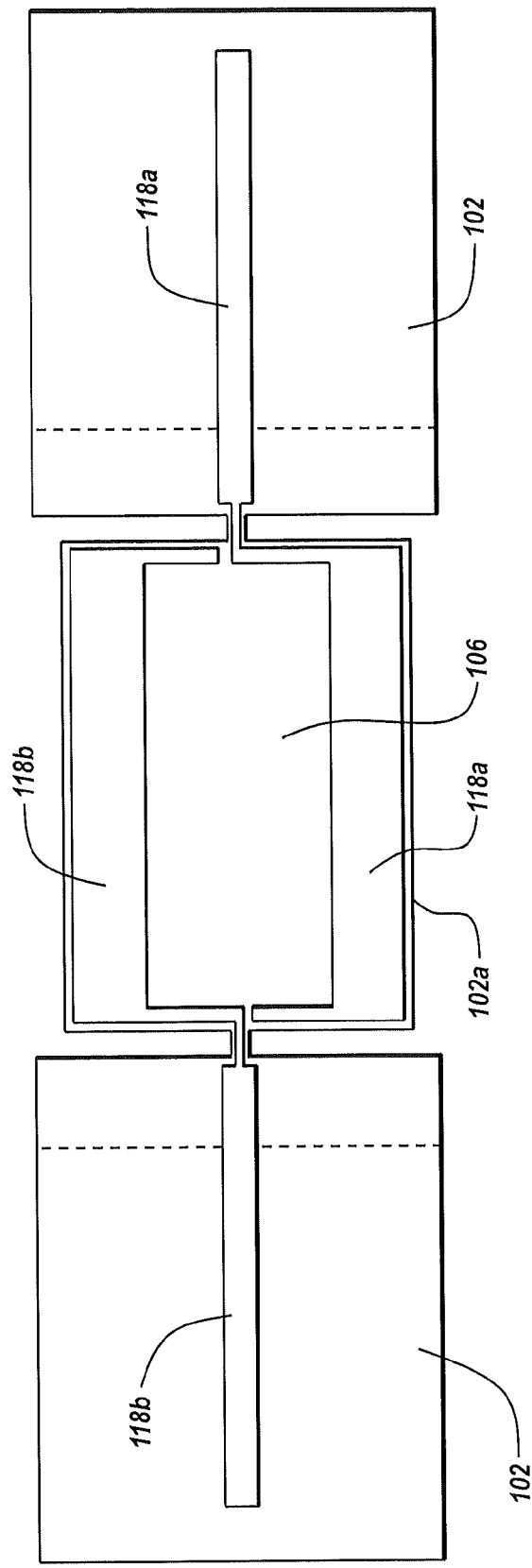
FIGS. 6A-6B are plan views of microelectromechanical bulk acoustic resonators that utilized patterned electrodes to enhance quality factor, according to embodiments of the present invention.
Figure 6B:
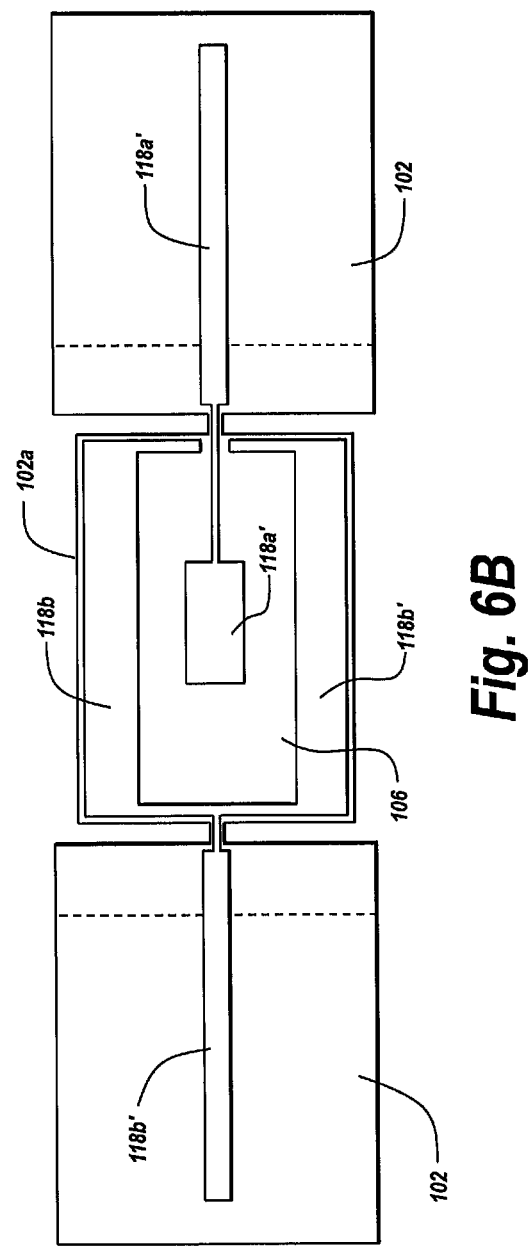

FIGS. 6A-6B are plan views of microelectromechanical bulk acoustic resonators that utilize uniquely shaped electrodes to enhance quality factor, according to embodiments of the present invention. In particular, FIGS. 6A-6B illustrate resonators having electrodes (118a, 118b) and (118a', 118b') thereon, which are patterned to achieve an optimized or nearly optimized balance between high resonator quality (Q) resulting from relatively small surface/interface loss (achieved by small electrode area on the resonator surface) and low motional impedance (e.g., low insertion loss) resulting from higher piezoelectric coupling (achieved by sufficiently large electrode area on the resonator surface). FIG. 6A illustrates a resonator including a resonator body 102a anchored to a surrounding substrate 102 by a pair of tethers and a pair of facing C-shaped input and output electrodes 118a and 118b that extend adjacent outer edges of the resonator body 102a when viewed from a top down perspective. Alternatively, FIG. 6B illustrates a resonator including a resonator body 102a anchored to a surrounding substrate 102 by a pair of tethers and a pair input and output electrodes 118a' and 118b'. As shown, the input electrode 118a' may be rectangular shaped electrode located at a center of the resonator body 102a and the output electrode 118b' may be a four-sided frame-shaped electrode that extends adjacent outer edges of the resonator body 102a and substantially surrounds the input electrode 118a'.

Referring now to FIGS. 7A-7B, a microelectromechanical bulk acoustic resonator will be described that utilizes additional materials with positive temperature coefficients of frequency to achieve passive temperature compensation. In particular, FIGS. 7A-7B illustrate a resonator containing a composite stack of a resonator body 102a (e.g., silicon body), a bottom electrode 104 (e.g., Mo electrode) on the resonator body 102a, a piezoelectric layer 106 (e.g., AlN layer) on the bottom electrode 104 and a pair of top electrodes 108a, 108b on the piezoelectric layer 106, which contain interdigitated fingers that partially cover a surface of the piezoelectric layer 106. In addition, first and second electrically insulating layers 140a, 142a (e.g., silicon dioxide layers), which are formed of materials having positive temperature coefficients of frequency (TCFs), are provided directly on bottom and upper surfaces of the resonator body 102a. These layers 140a, 142a can be provided to achieve passive temperature compensation while simultaneously balancing mechanical stresses on the resonator body 102a and also preventing the layers 140a, 142a from becoming the dominant resonating layers by virtue of the relatively high acoustic loss characteristics of the layers 140a, 142a. By choosing the total and relative thicknesses of the layers 140a, 142a appropriately, nearly total temperature compensation can be achieved for the composite stack of layers. As further illustrated by FIG. 7A, the resonator may be anchored to a surrounding substrate using a single pair of tethers 50. This substrate is illustrated as including a substrate body 100 having a first electrically insulating layer 140 thereon, a resonator body layer 102 on the insulating layer 140 and a second electrically insulating layer 142 on the resonator body layer 102.

Although not wishing to be bound by any theory, in order to at least substantially compensate for the negative TCF associated with a resonator containing a composite stack of the metal electrode, resonator body and piezoelectric layer, the total thicknesses of the first and second electrically insulating layers 140a, 142a may be chosen based on the following analytical expression applicable to a four material composite structure (e.g., SiO$_2$, Mo, AlN, Si), where ppm$_n$ represents material n's temperature coefficient of elasticity (TCE), t$_n$ represents material n's thickness and E$_n$ represents material n's Young's modulus:

$$ppm = \sqrt{\frac{(ppm_1+1)^2 E_1 t_1 + (ppm_2+1)^2 E_2 t_2 + (ppm_3+1)^2 E_3 t_3 + (ppm_4+1)^2 E_4 t_4}{E_1 t_1 + E_2 t_2 + E_3 t_3 + E_4 t_4}} - 1$$

FIGS. 8A-8B illustrate a microelectromechanical bulk acoustic resonator that is similar to the resonator of FIGS. 7A-7B, but includes longer interdigitated electrodes and an asymmetric arrangement of two tethers 50 that support the first electrode 108a at two nodal lines and one tether 50 that supports the second electrode 108b at a central nodal line. FIGS. 9A-9B illustrate a microelectromechanical bulk acoustic resonator that is similar to the resonator of FIGS. 8A-8B, but includes a different asymmetric arrangement of two tethers 50 that support the second electrode 108b at two nodal lines and one tether 50 that supports the first electrode 108b at a central nodal line. FIGS. 10A-10B illustrate a microelectromechanical bulk acoustic resonator that is similar to the resonator of FIGS. 9A-9B, but includes a different asymmetric arrangement of two tethers 50 that support the second electrode 108b at two nodal lines and two tethers 50 that support the first electrode 108a at two different nodal lines.

FIGS. 11A-11B illustrate a microelectromechanical bulk acoustic resonator that is similar to the resonator of FIGS. 10A-10B, but includes a different symmetrical arrangement of two tethers 50 that support the second electrode 108b at two nodal lines and two tethers 50 that support the first electrode 108a at the same two nodal lines. FIGS. 12A-12B illustrate a microelectromechanical bulk acoustic resonator that is similar to the resonator of FIGS. 11A-11B, but includes a different asymmetrical arrangement of three tethers 50 that support the second electrode 108b at three nodal lines and two tethers 50 that support the first electrode 108a at two different nodal lines. FIGS. 13A-13B illustrate a microelectromechanical bulk acoustic resonator that is similar to the resonator of FIGS. 12A-12B, but includes a different asymmetrical arrangement of three tethers 50 that support the second electrode 108b at three nodal lines and two tethers 50 that support the first electrode 108a at two nodal lines, which overlap with two of three nodal lines.

FIGS. 14A-14B illustrate a microelectromechanical bulk acoustic resonator that is similar to the resonator of FIGS. 13A-13B, but includes a different asymmetrical arrangement of three tethers 50 that support the second electrode 108b at three nodal lines (including the center nodal line) and three tethers 50 that support the first electrode 108a at three nodal lines (including the center nodal line). FIGS. 15A-15B illustrate a microelectromechanical bulk acoustic resonator that is similar to the resonator of FIGS. 14A-14B, but includes a symmetrical arrangement of three tethers 50 that support the second electrode 108b at three nodal lines (including the center nodal line) and three tethers 50 that support the first electrode 108a at three nodal lines (including the center nodal line).

FIGS. 16A-16B illustrate a microelectromechanical bulk acoustic resonator that is similar to the resonator of FIGS. 12A-12B, but includes a different asymmetrical arrangement of three tethers 50 that support the second electrode 108b at three nodal lines (including the center nodal line) and four tethers 50 on the other side that support the first electrode 108a at two nodal lines. FIGS. 17A-17B illustrate a microelectromechanical bulk acoustic resonator that is similar to the resonator of FIGS. 16A-16B, but includes a different asymmetrical arrangement of three tethers 50 that support the second electrode 108b at three nodal lines (including the center nodal line) and four tethers 50 on the other side that support the first electrode 108a at two nodal lines that overlap with two of the three nodal lines associated with the second electrode 108b.

FIGS. 18A-18B illustrate a microelectromechanical bulk acoustic resonator that includes a symmetric arrangement of four tethers on both sides of the resonator body 102a, but where the second electrode 108b is supported at four nodal lines (not including the center nodal line) and the first electrode 108a is supported at two nodal lines (not including the center nodal line). FIGS. 19A-19B illustrate a microelectromechanical bulk acoustic resonator that includes an asymmetric arrangement of five tethers that support second electrode 108b at five nodal lines (including the center nodal line) and four tethers on the other side that support the first electrode 108a at two nodal lines (not including the center nodal line). FIGS. 20A-20B illustrate a microelectromechanical bulk acoustic resonator that includes a symmetric arrangement of five tethers that support second electrode 108b at five nodal lines (including the center nodal line) and five tethers that support the first electrode 108a at three nodal lines (including the center nodal line).

Figure 22B:
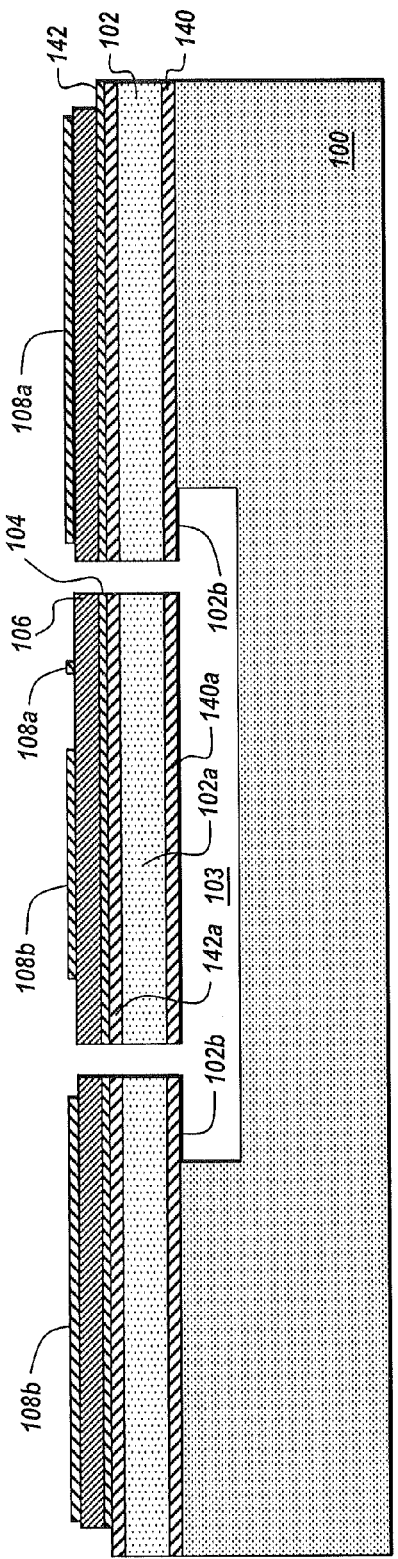
FIG. 22B is a cross-sectional view of the microelectromechanical bulk acoustic resonator of FIG. 22A, taken along line 22B-22B'.
Figure 22A:
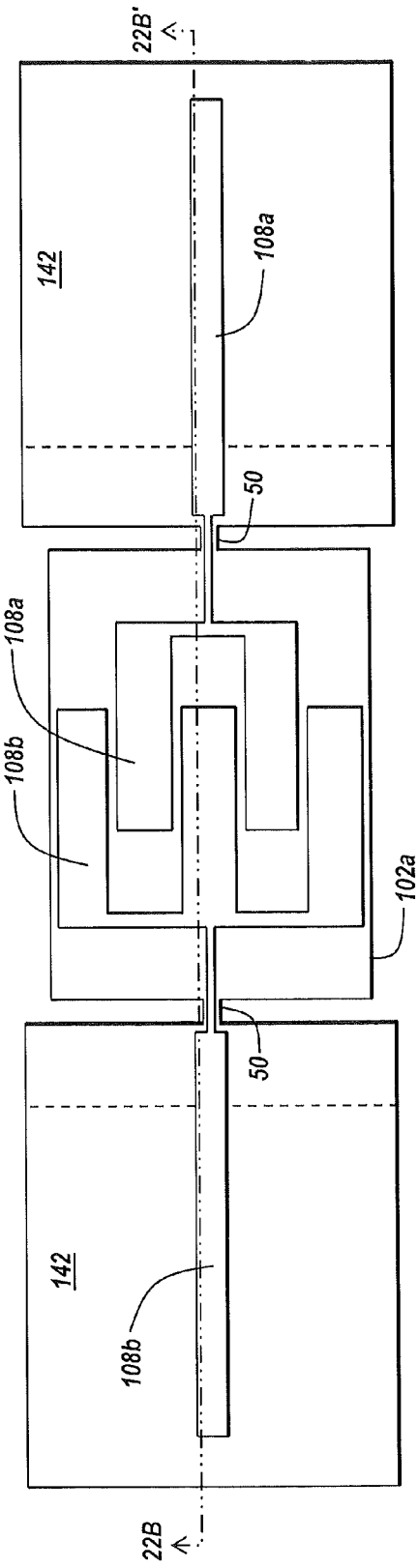
FIG. 22A is a plan view of a microelectromechanical bulk acoustic resonator that utilizes materials with positive temperature coefficients of frequency to achieve passive temperature compensation, according to an embodiment of the present invention.

FIGS. 21A-21B illustrate a microelectromechanical bulk acoustic resonator that includes reduced area electrodes with interdigitated fingers (long and short) that are patterned to achieve an optimized or nearly optimized balance between high resonator quality (Q) resulting from relatively small surface/interface loss (achieved by small electrode area on the resonator surface) and low motional impedance (e.g., low insertion loss) resulting from higher piezoelectric coupling (achieved by sufficiently large electrode area on the resonator surface). FIGS. 22A-22B illustrate a microelectromechanical bulk acoustic resonator that includes reduced area electrodes with partially overlapping interdigitated fingers having the same length, which are patterned to achieve an optimized or nearly optimized balance between high resonator quality (Q) resulting from relatively small surface/interface loss (achieved by small electrode area on the resonator surface) and low motional impedance (e.g., low insertion loss) resulting from higher piezoelectric coupling (achieved by sufficiently large electrode area on the resonator surface). FIGS. 23A-23B illustrate a microelectromechanical bulk acoustic resonator that includes reduced area electrodes with fully overlapping interdigitated fingers having the same length, which are patterned to achieve an optimized or nearly optimized balance between high resonator quality (Q) resulting from relatively small surface/interface loss (achieved by small electrode area on the resonator surface) and low motional impedance (e.g., low insertion loss) resulting from higher piezoelectric coupling (achieved by sufficiently large electrode area on the resonator surface).

Figure 24A:
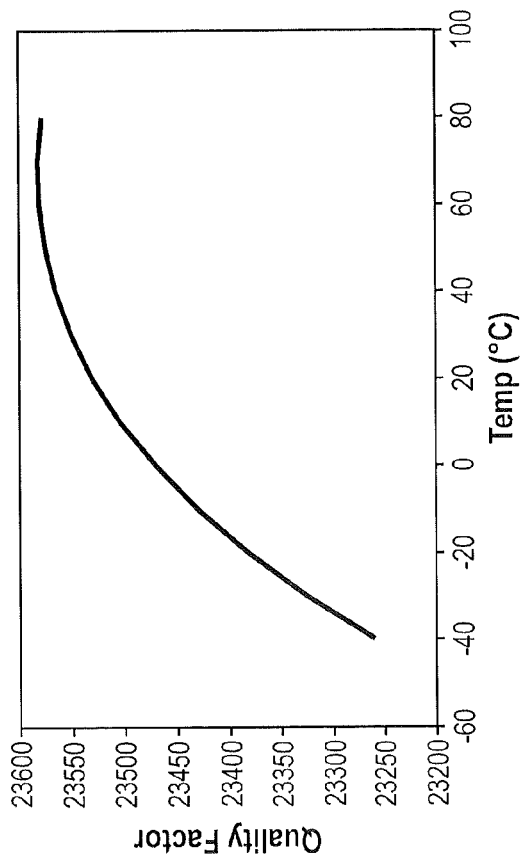
FIGS. 24A-24B are graphs showing simulated quality factor (Q) of packaged TPoS resonators versus temperature for TPoS resonators having a $Q_{air} < (0.5) Q_{TED}$, according to embodiments of the invention.
Figure 24B:
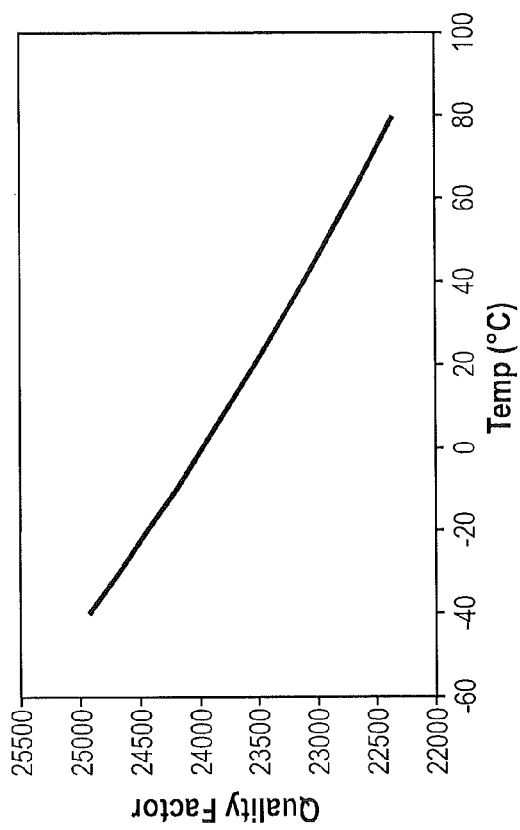

Methods of testing packaged thin-film piezoelectric-on-semiconductor (TPoS) microelectromechanical resonators having hermetic seals may include measuring a quality factor (Q) of resonance of the resonator at at least two unequal temperatures to determine whether a $\Delta Q/\Delta T$ is different (e.g., by at least 50%) over a temperature range ($\Delta T$) spanning a smallest and largest of the at least two temperatures. As illustrated by FIGS. 24A-24B, in-line hermetic testing of packaged thin-film piezoelectric-on-semiconductor (TPoS) microelectromechanical resonators may be utilized to determine whether the packaged resonator is sealed (e.g., hermetically) or open to a surrounding ambient. For example, as shown by FIG. 24A, a quality factor (Q) that is monotonically increasing as a function of increasing temperature (T) will reflect a quality factor that is somewhat positively proportional to T (e.g., $T^{1/2}$) which means the package does not provide a hermetic seal between the resonator and a surrounding ambient. On the other hand, as shown by FIG. 24B, a quality factor (Q) that is monotonically decreasing as a function of increasing temperature (T) will reflect a quality factor that is somewhat negatively proportional to T (e.g., $1/(T)^{1/2}$), which means the package provides a hermetic seal. These observations may be applicable for those situations where $Q_{AIR} < Q_T ED$ and, more preferably, where $Q_{air} < (0.9) Q_{TED}$ over the measurement temperature range, where $Q_{AIR}$ is the quality factor of the packaged resonator due to air damping and $Q_{TED}$ is the quality factor of the packaged resonator due to thermoelastic damping. These observations are generally applicable to TPoS resonators having a total quality factor $Q_{total}$ characterized by the following relationship: $Q_{total} = [(1/Q_{air})(1/Q_{TED})(1/Q_{anchor})(1/Q_{surface})]^{-1}$, where $Q_{anchor}$ is the quality factor due to anchor loss and $Q_{surface}$ is the quality factor due to surface loss. The graphs of FIGS. 24A-24B were simulated for TPoS resonators having the following contributions to total quality factor: $Q_{air} = 90,000$, $Q_{TED} = 200,000$, $Q_{anchor} = 40,000$ and $Q_{surface} = 30,000$.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of testing a packaged thin-film piezoelectric-on-semiconductor microelectromechanical resonator, comprising:

measuring a quality factor of resonance (Q) of the packaged resonator at at least two unequal temperatures to determine a change in quality factor (EQ) over a temperature range (ΔT) spanning a smallest and largest of the at least two temperatures, for a packaged resonator having a $Q_{AIR} < Q_{TED}$, where $Q_{AIR}$ is the quality factor of resonance of the packaged resonator due to air damping and $Q_{TED}$ is the quality factor of resonance of the packaged resonator due to thermoelastic damping, said measuring comprising determining that the packaged resonator has a defective hermetic seal in the event a ΔQ/ΔT of the packaged resonator is at least 50% different than an otherwise equivalent packaged resonator having a hermetic seal.

2. The method of claim 1, wherein said measuring comprises heating the packaged resonator from room temperature to a higher temperature.

3. The method of claim 1, wherein the packaged resonator is configured so that $Q_{air} < (0.9) Q_{TED}$ at the smallest and largest of the at least two temperatures.

4. The method of claim 1, wherein the packaged resonator is configured so that $Q_{air} < (0.5) Q_{TED}$ at the smallest of the at least two temperatures.

* * * * *